(12) United States Patent
Tayebati et al.

(10) Patent No.: US 11,480,846 B2
(45) Date of Patent: Oct. 25, 2022

(54) SYSTEMS AND METHODS FOR LASER SYSTEMS WITH VARIABLE BEAM PARAMETER PRODUCT

(71) Applicants: Parviz Tayebati, Sherborn, MA (US); Wang-Long Zhou, Andover, MA (US); Bien Chann, Merrimack, NH (US); Bryan Lochman, Nashville, TN (US)

(72) Inventors: Parviz Tayebati, Sherborn, MA (US); Wang-Long Zhou, Andover, MA (US); Bien Chann, Merrimack, NH (US); Bryan Lochman, Nashville, TN (US)

(73) Assignee: TeraDiode, Inc., Wilmington, MA (US)

( * ) Notice: Subject to any disclaimer, the term of this patent is extended or adjusted under 35 U.S.C. 154(b) by 4 days.

(21) Appl. No.: 17/141,365

(22) Filed: Jan. 5, 2021

(65) Prior Publication Data

US 2021/0199902 A1 Jul. 1, 2021

Related U.S. Application Data

(63) Continuation of application No. 16/292,622, filed on Mar. 5, 2019, now Pat. No. 10,914,902, which is a (Continued)

(51) Int. Cl.
*G02B 6/42* (2006.01)
*G02F 1/33* (2006.01)
(Continued)

(52) U.S. Cl.
CPC .......... *G02F 1/33* (2013.01); *B23K 26/0626* (2013.01); *G02B 6/2706* (2013.01); *G02B 6/32* (2013.01); *G02B 6/4206* (2013.01); *G02B 6/4214* (2013.01); *G02B 6/4215* (2013.01); *G02B 6/4296* (2013.01); *G02F 1/332* (2013.01); *H01S 3/0071* (2013.01); *H01S 3/08086* (2013.01); *H01S 3/23* (2013.01); *G02B 6/4213* (2013.01); *G02F 2201/02* (2013.01); *G02F 2203/06* (2013.01); *G02F 2203/28* (2013.01)

(58) Field of Classification Search
CPC ................................ G02B 6/2706; G02B 6/32
See application file for complete search history.

(56) References Cited

U.S. PATENT DOCUMENTS

| 4,773,719 A | 9/1988 | Anderson et al. |
| 5,187,543 A | 2/1993 | Ebert |

(Continued)

FOREIGN PATENT DOCUMENTS

| WO | 03/010568 A1 | 2/2003 | |
| WO | 2004/031741 A2 | 4/2004 | |
| WO | WO-2011124671 A1 * | 10/2011 | ........... B23K 26/064 |

OTHER PUBLICATIONS

International Search Report and Written Opinion issued in a corresponding International Application No. PCT/US2015/037105 dated Oct. 26, 2015.

*Primary Examiner* — Daniel Petkovsek
(74) *Attorney, Agent, or Firm* — Morgan, Lewis & Bockius, LLP

(57) ABSTRACT

In various embodiments, a beam-parameter adjustment system and focusing system alters a spatial power distribution of a radiation beams before the beam is coupled into an optical fiber or delivered to a workpiece.

18 Claims, 31 Drawing Sheets

Related U.S. Application Data continuation of application No. 15/636,065, filed on Jun. 28, 2017, now Pat. No. 10,261,271, which is a continuation of application No. 15/207,749, filed on Jul. 12, 2016, now Pat. No. 9,726,834, which is a continuation of application No. 14/747,073, filed on Jun. 23, 2015, now Pat. No. 9,435,964, which is a continuation-in-part of application No. 14/632,283, filed on Feb. 26, 2015, now Pat. No. 9,310,560.

(60) Provisional application No. 62/016,779, filed on Jun. 25, 2014, provisional application No. 62/083,724, filed on Nov. 24, 2014, provisional application No. 61/944,989, filed on Feb. 26, 2014, provisional application No. 61/986,237, filed on Apr. 30, 2014.

(51) Int. Cl.
  *B23K 26/06* (2014.01)
  *G02B 6/32* (2006.01)
  *H01S 3/23* (2006.01)
  *G02B 6/27* (2006.01)
  *H01S 3/00* (2006.01)
  *H01S 3/08* (2006.01)

(56) References Cited

U.S. PATENT DOCUMENTS

| | | |
|---|---|---|
| 5,638,396 A | 6/1997 | Klimek |
| 5,694,385 A | 12/1997 | Takahashi et al. |
| 6,781,734 B2 | 8/2004 | Vail et al. |
| 6,804,436 B2 | 10/2004 | Healy |
| 6,914,916 B2 | 7/2005 | Pezeshki et al. |
| 7,558,298 B2 | 7/2009 | Metivier et al. |
| 8,724,222 B2 | 5/2014 | Chann et al. |
| 8,781,269 B2 | 7/2014 | Huber et al. |
| 9,250,390 B2 * | 2/2016 | Muendel ............ G02B 6/4216 |
| 9,435,964 B2 | 9/2016 | Tayebati et al. |
| 9,482,821 B2 | 11/2016 | Huber et al. |
| 9,726,834 B2 | 8/2017 | Tayebati et al. |
| 10,074,958 B2 | 9/2018 | Wakabayashi et al. |
| 10,088,632 B2 | 10/2018 | Zhou et al. |
| 10,261,271 B2 | 4/2019 | Huber et al. |
| 10,281,656 B2 | 5/2019 | Huber et al. |
| 10,630,047 B2 | 4/2020 | Zhou et al. |
| 10,914,902 B2 * | 2/2021 | Tayebati ............ G02B 6/4296 |
| 2002/0114553 A1 | 8/2002 | Mead |
| 2003/0048523 A1 | 3/2003 | Gerstenberger |
| 2004/0130989 A1 | 7/2004 | Hashimoto et al. |
| 2005/0270630 A1 | 12/2005 | Johnson |
| 2006/0018002 A1 | 1/2006 | Singh |
| 2006/0051022 A1 | 3/2006 | Levner |
| 2007/0071061 A1 | 3/2007 | Pietra |
| 2010/0130989 A1 | 5/2010 | Bourque et al. |
| 2011/0027494 A1 | 2/2011 | Tan et al. |
| 2015/0049987 A1 * | 2/2015 | Grasso ............ G02B 6/4296 385/33 |
| 2015/0378184 A1 | 12/2015 | Tayebati et al. |
| 2017/0293084 A1 | 10/2017 | Zhou et al. |
| 2017/0336580 A1 | 11/2017 | Tayebati et al. |
| 2018/0210144 A1 | 7/2018 | Villarreal-Saucedo et al. |
| 2018/0364431 A1 | 12/2018 | Zhao |
| 2019/0258009 A1 | 8/2019 | Tayebati et al. |
| 2019/0265419 A1 | 8/2019 | Tayebati et al. |
| 2020/0014772 A1 | 1/2020 | Swildens et al. |

* cited by examiner

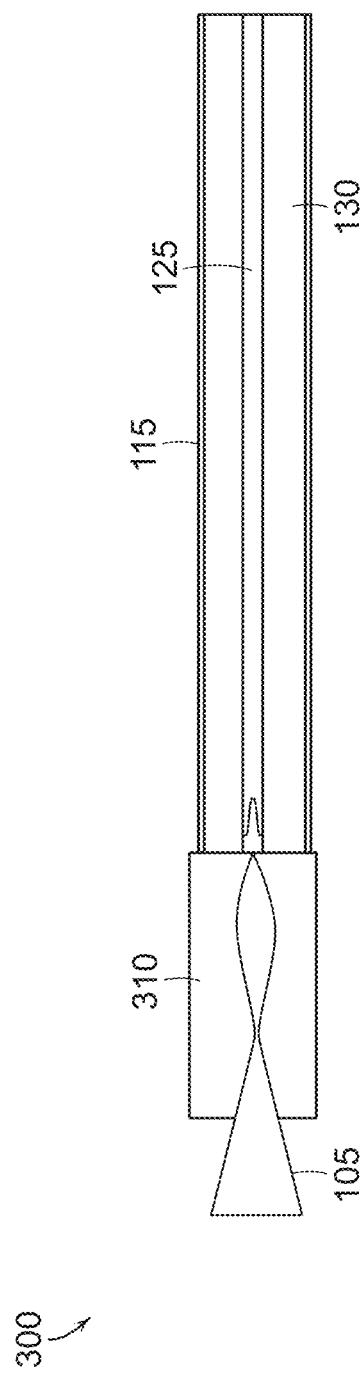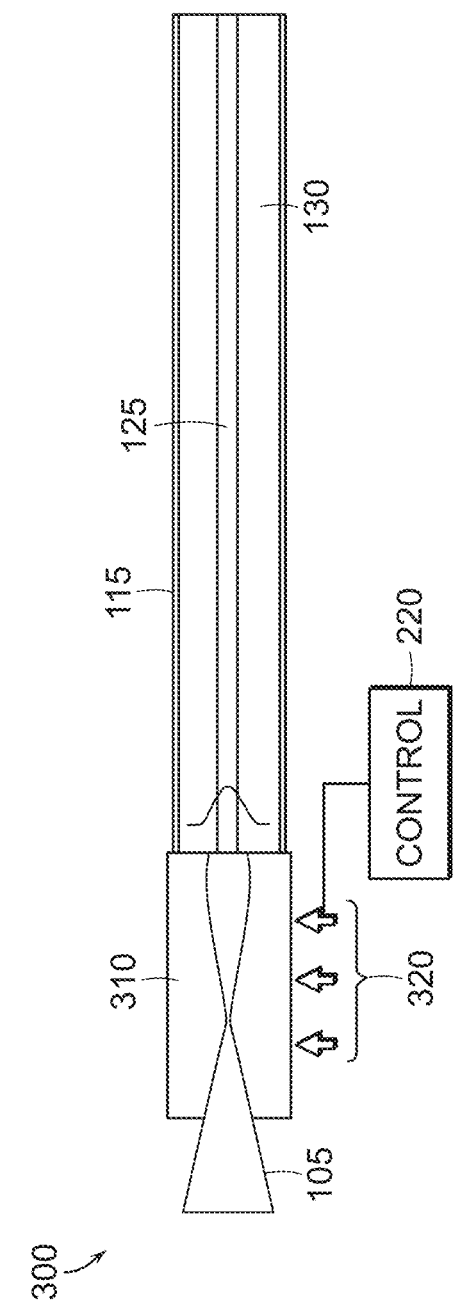

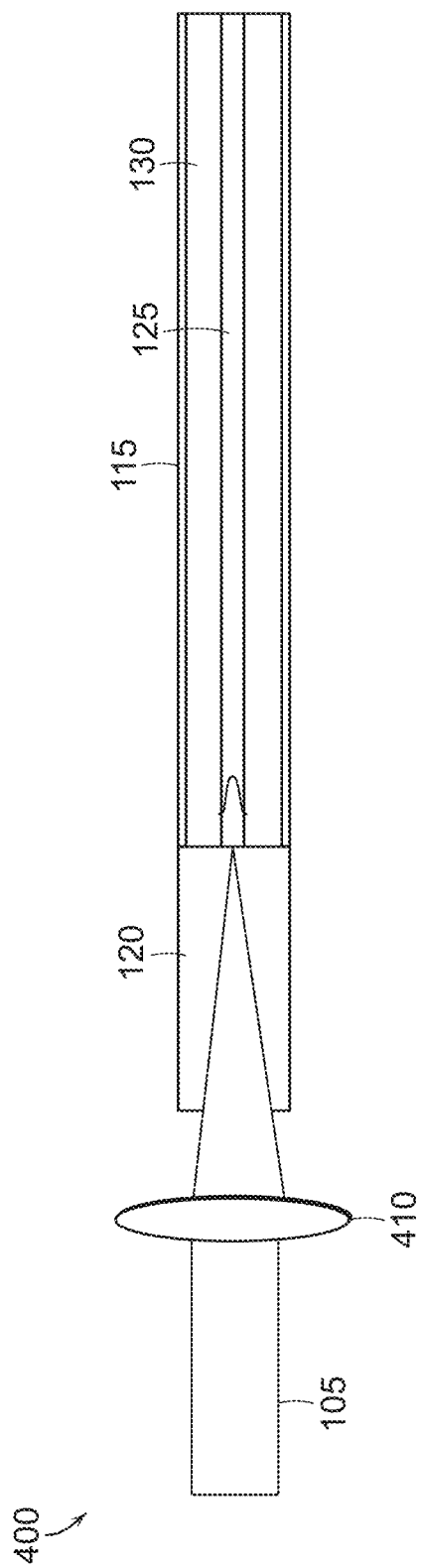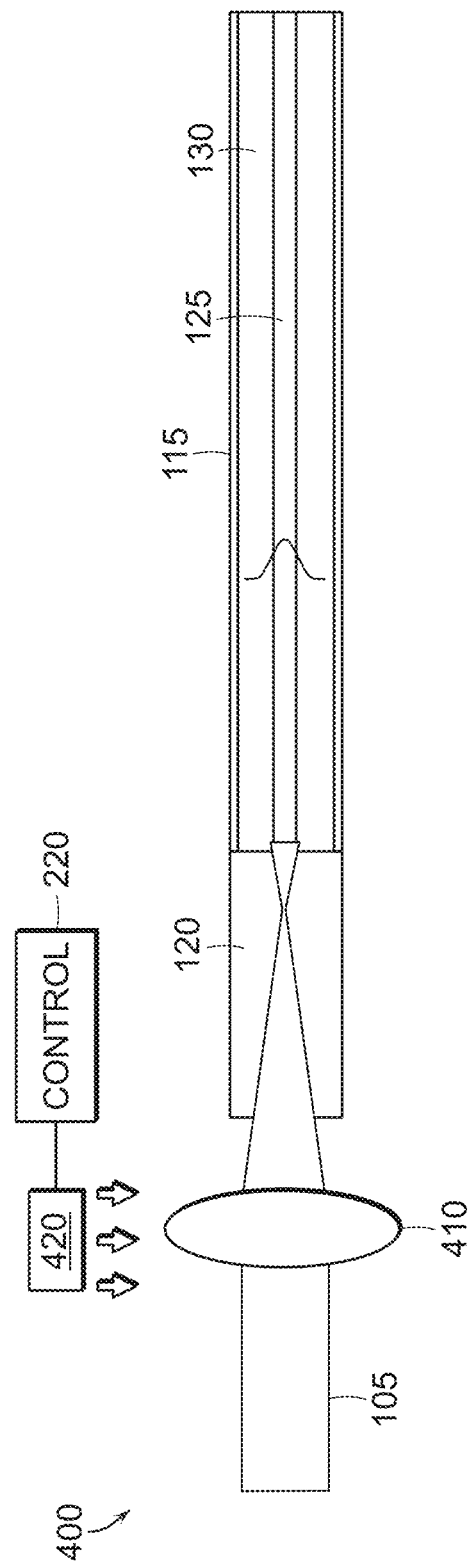

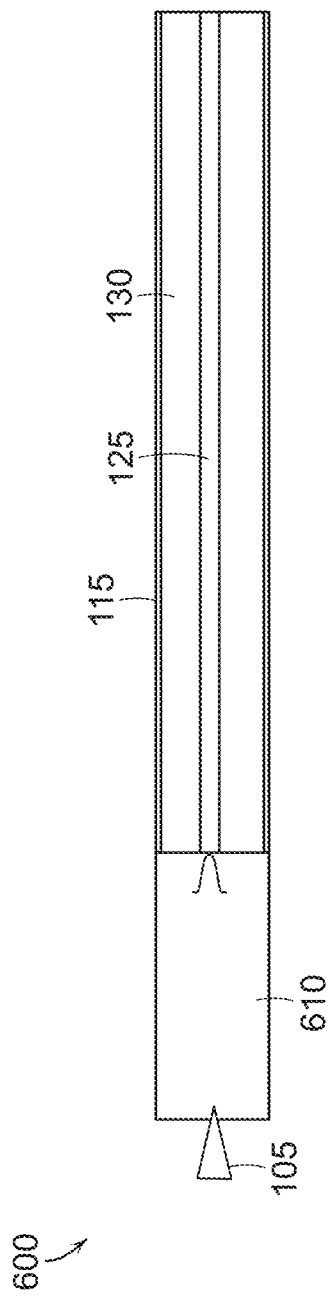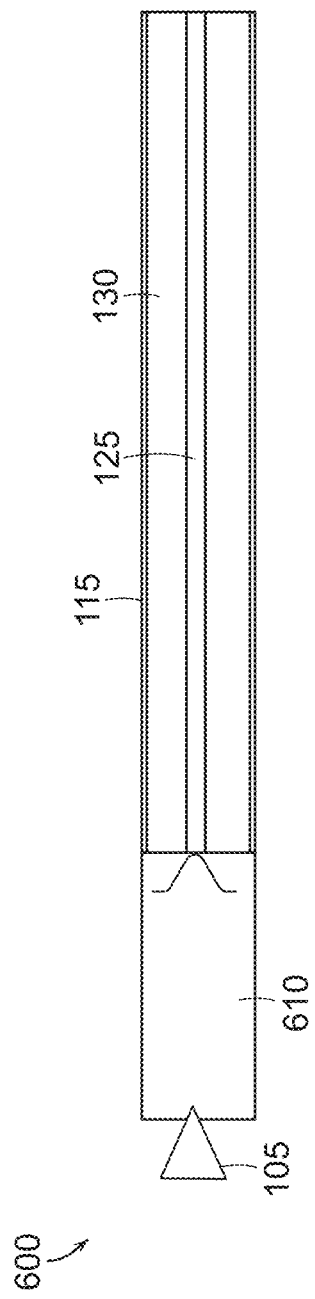

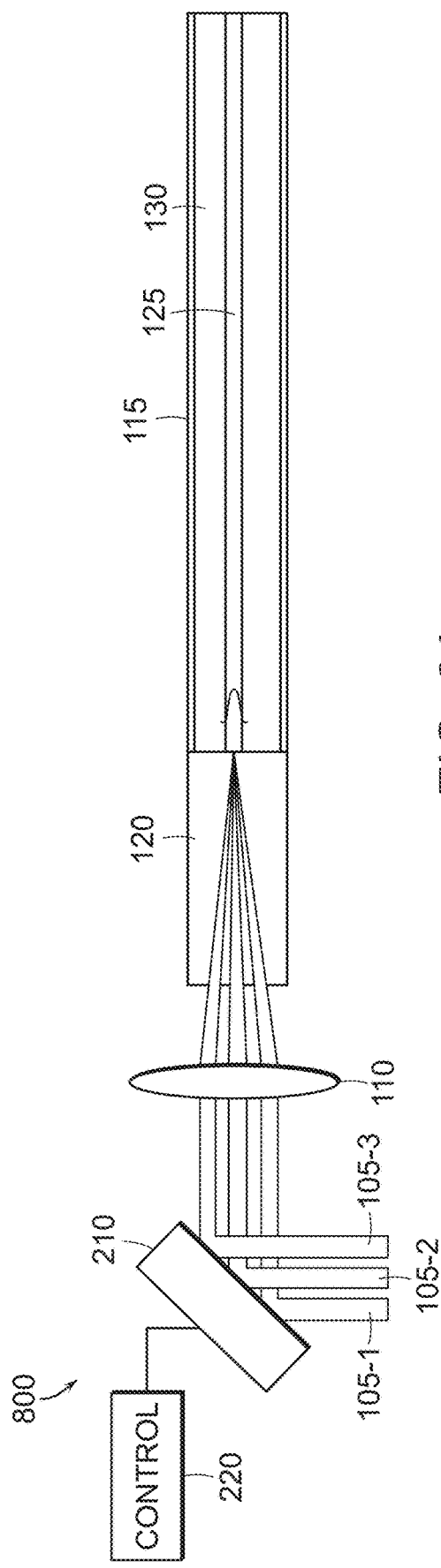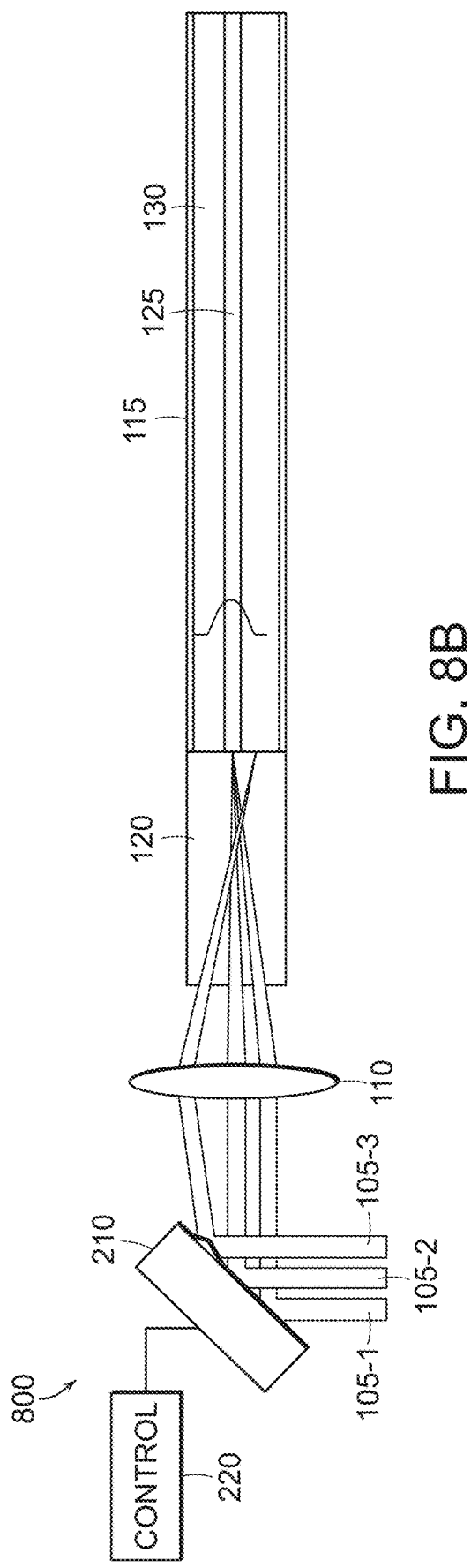

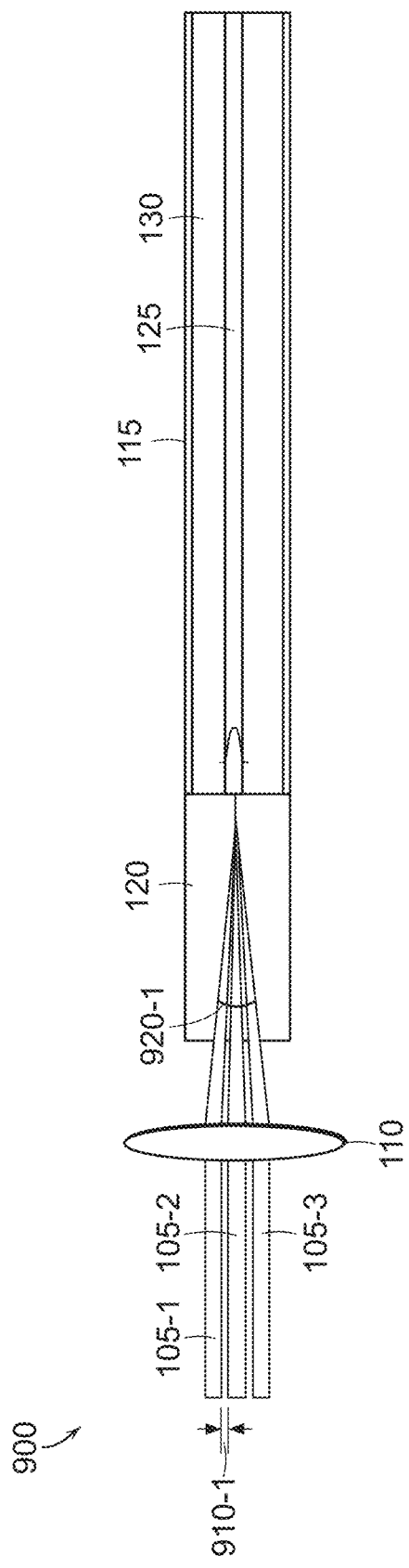
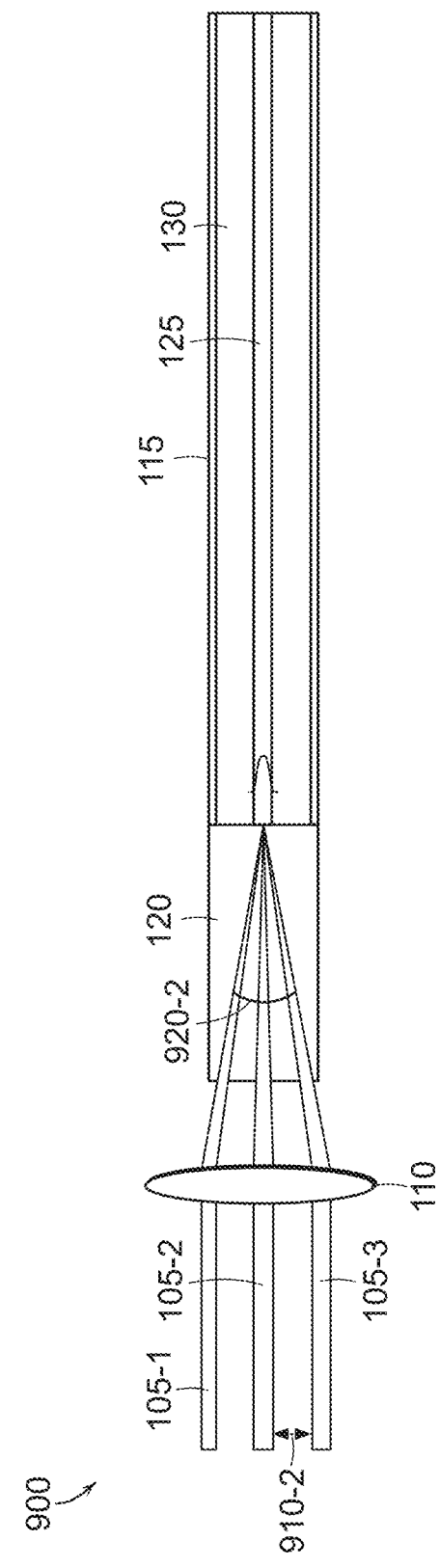

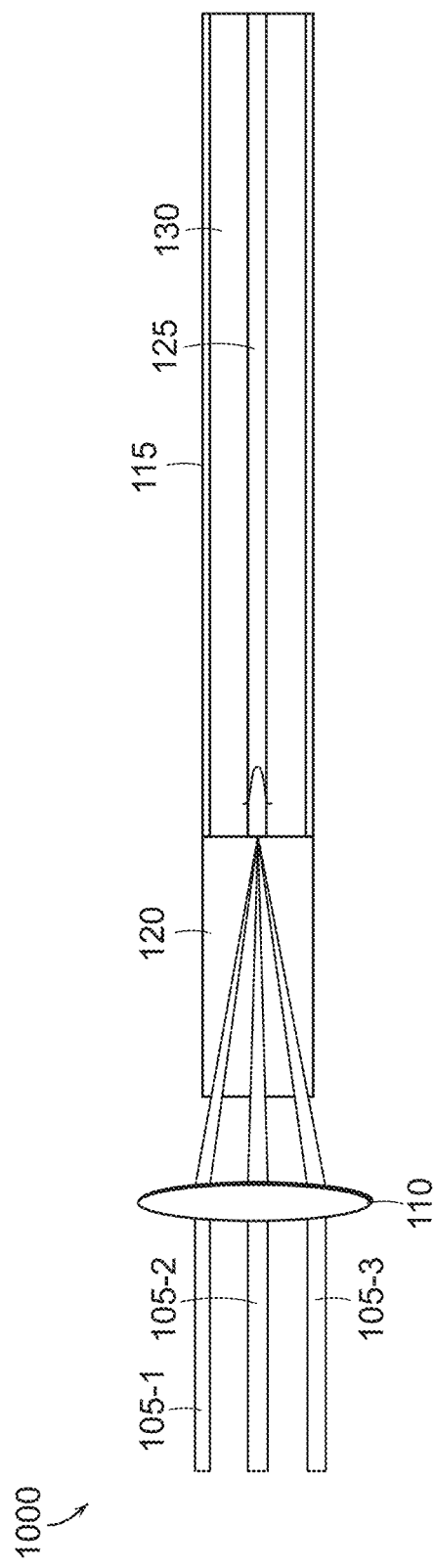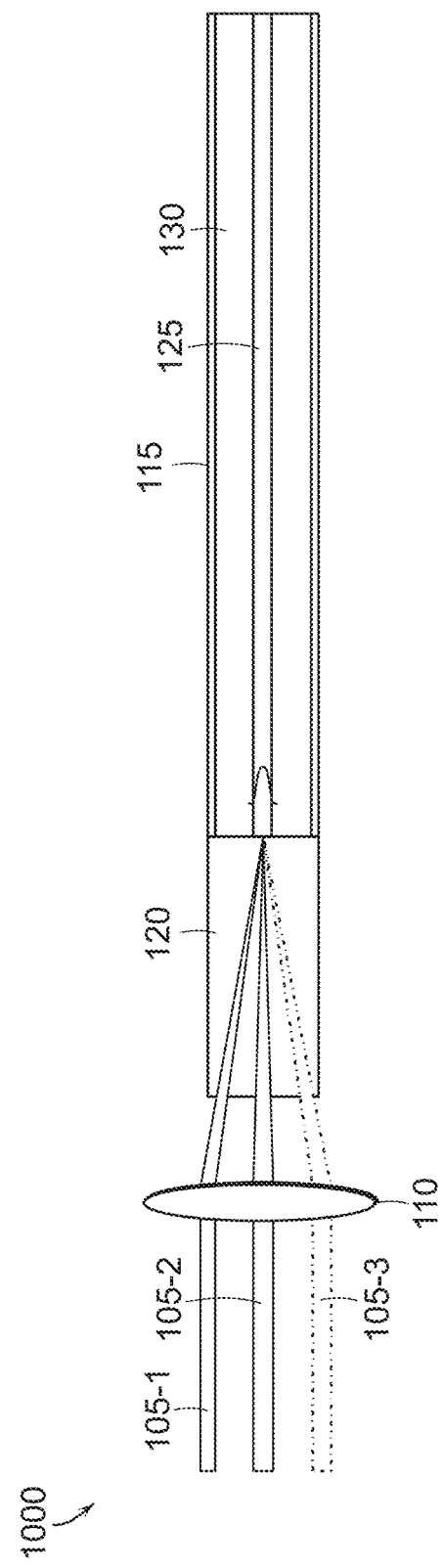

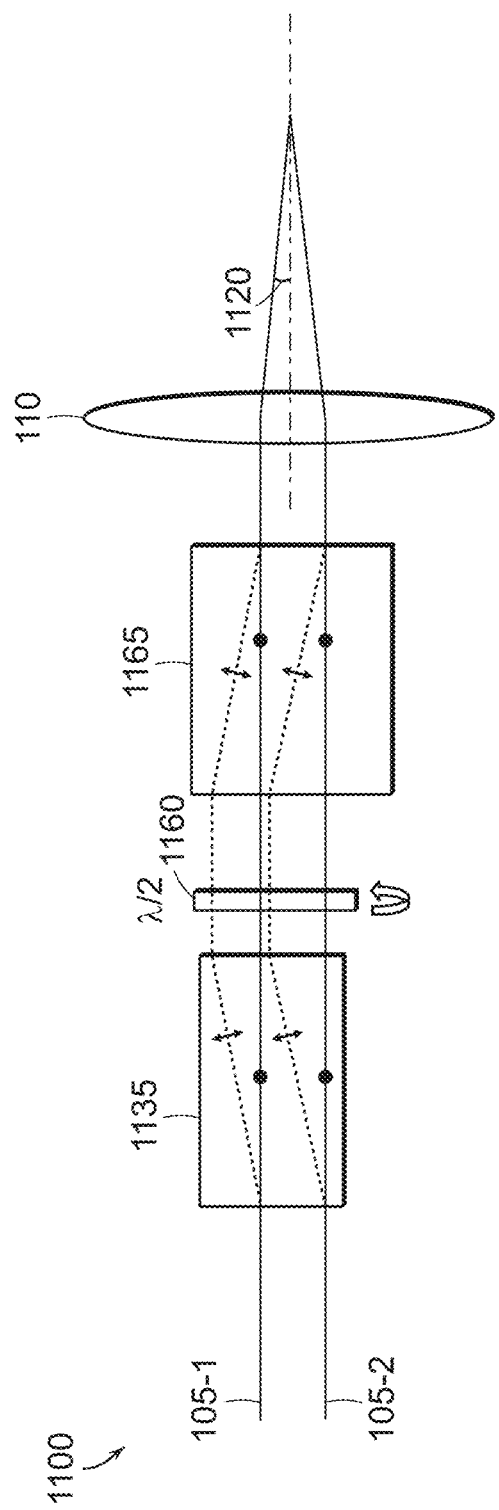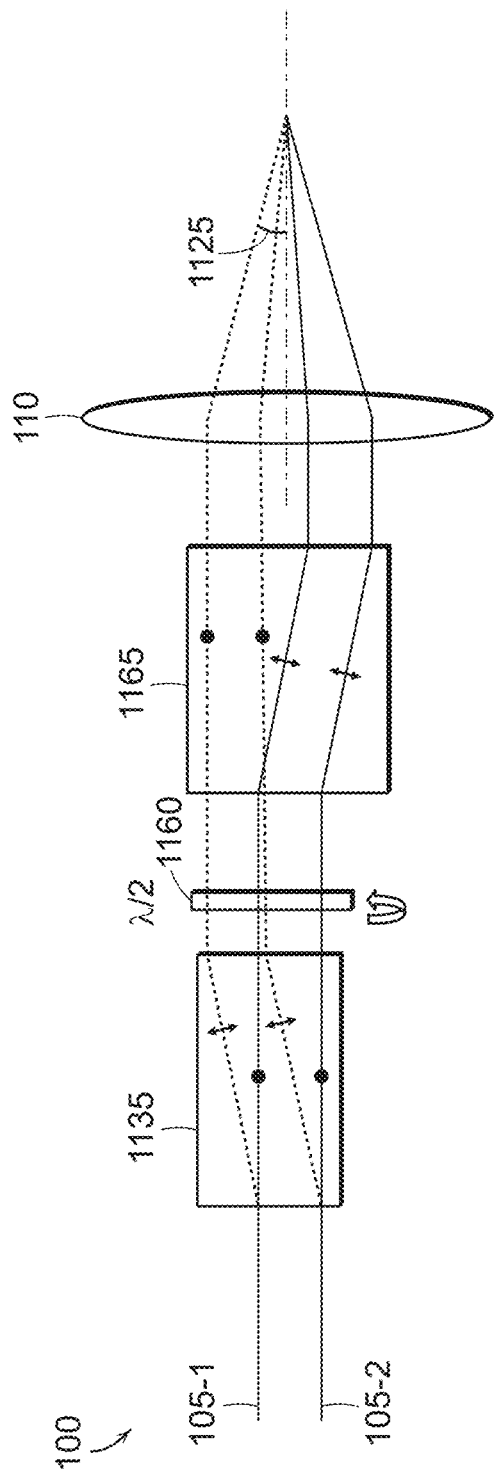

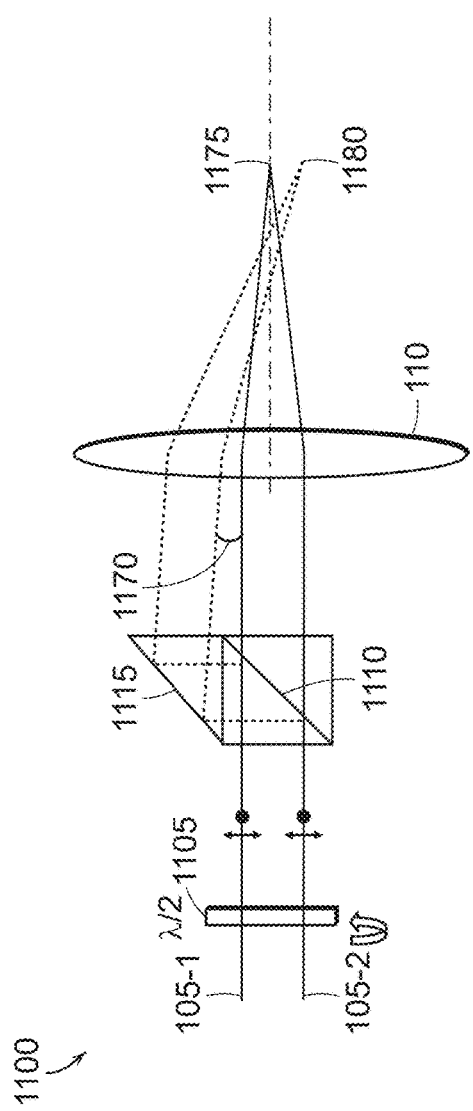
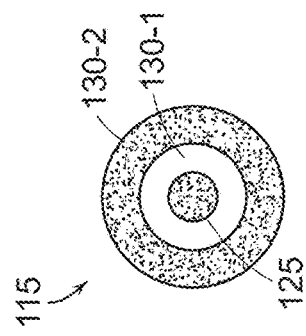
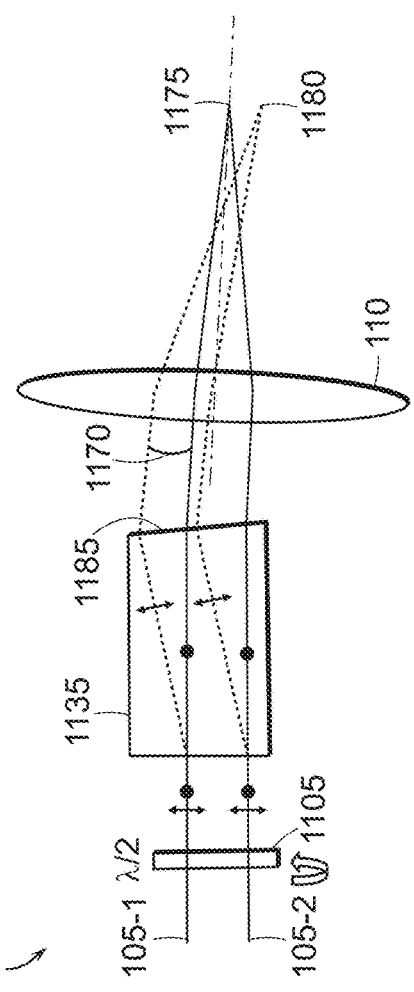
FIG. 11I
FIG. 11J
FIG. 11K

SYSTEMS AND METHODS FOR LASER SYSTEMS WITH VARIABLE BEAM PARAMETER PRODUCT

RELATED APPLICATIONS

This application is a continuation of U.S. patent application Ser. No. 16/292,622, filed Mar. 5, 2019, now issued as U.S. Pat. No. 10,914,902, which is a continuation of U.S. patent application Ser. No. 15/636,065, filed Jun. 28, 2017, now issued as U.S. Pat. No. 10,261,271, which is a continuation of U.S. patent application Ser. No. 15/207,749, filed Jul. 12, 2016, now issued as U.S. Pat. No. 9,726,834, which is a continuation of U.S. patent application Ser. No. 14/747,073, filed Jun. 23, 2015, now issued as U.S. Pat. No. 9,435,964, which claims the benefit of and priority to U.S. Provisional Patent Application No. 62/016,779, filed Jun. 25, 2014, and U.S. Provisional Patent Application No. 62/083,724, filed Nov. 24, 2014. U.S. patent application Ser. No. 14/747,073, filed Jun. 23, 2015, now issued as U.S. Pat. No. 9,435,964, is also a continuation-in-part of U.S. patent application Ser. No. 14/632,283, filed Feb. 26, 2015, now issued as U.S. Pat. No. 9,310,560, which claims the benefit of and priority to U.S. Provisional Patent Application No. 61/944,989, filed Feb. 26, 2014, and U.S. Provisional Patent Application No. 61/986,237, filed Apr. 30, 2014. The entire disclosure of each of these applications is hereby incorporated herein by reference.

TECHNICAL FIELD

In various embodiments, the present invention relates to laser systems, specifically laser systems with controllable beam parameter products.

BACKGROUND

High-power laser systems are utilized for a host of different applications, such as welding, cutting, drilling, and materials processing. Such laser systems typically include a laser emitter, the laser light from which is coupled into an optical fiber (or simply a "fiber"), and an optical system that focuses the laser light from the fiber onto the workpiece to be processed. The optical system is typically engineered to produce the highest-quality laser beam, or, equivalently, the beam with the lowest beam parameter product (BPP). The BPP is the product of the laser beam's divergence angle (half-angle) and the radius of the beam at its narrowest point (i.e., the beam waist, the minimum spot size). The BPP quantifies the quality of the laser beam and how well it can be focused to a small spot, and is typically expressed in units of millimeter-milliradians (mm-mrad). A Gaussian beam has the lowest possible BPP, given by the wavelength of the laser light divided by pi. The ratio of the BPP of an actual beam to that of an ideal Gaussian beam at the same wavelength is denoted $M^2$, which is a wavelength-independent measure of beam quality.

In many laser-processing applications, the desired beam spot size, divergence, and beam quality may vary depending on, for example, the type of processing and/or the type of material being processed. In order to make such changes to the BPP of the laser system, frequently the output optical system or the optical fiber must be swapped out with other components and/or realigned, a time-consuming and expensive process that may even lead to inadvertent damage of the fragile optical components of the laser system. Thus, there is a need for alternative techniques for varying the BPP of a laser system that do not involve such adjustments to the laser beam or optical system at the output of the optical fiber.

SUMMARY

Various embodiments of the present invention provide laser systems in which the BPP of the system (i.e., of its output laser beam) is varied via manipulation of one or more input laser beams that are coupled into an optical fiber, rather than via manipulation of the output beam that exits the fiber. This output beam with controllably variable BPP may be utilized to process a workpiece in such applications as welding, cutting, drilling, etc. Embodiments of the invention vary the focus spot and/or the beam quality of the input laser beam(s) in order to enable a controllably variable BPP at the output of the laser system. (References herein to an input laser beam are understood to mean "one or more input laser beams," i.e., including the possibility of multiple input laser beams, unless otherwise indicated.) For example, the focus spot of an input laser beam may be varied with the input beam having a fixed beam quality, or the beam quality (e.g., beam divergence, beam size, and/or power) of an input beam may be varied, or a combination of such techniques may be utilized.

Embodiments of the present invention couple the one or more input laser beams into an optical fiber. In various embodiments, the optical fiber has multiple cladding layers surrounding a single core, multiple discrete core regions (or "cores") within a single cladding layer, or multiple cores surrounded by multiple cladding layers.

Herein, "optical elements" may refer to any of lenses, mirrors, prisms, gratings, and the like, which redirect, reflect, bend, or in any other manner optically manipulate electromagnetic radiation. Herein, beam emitters, emitters, or laser emitters, or lasers include any electromagnetic beam-generating device such as semiconductor elements, which generate an electromagnetic beam, but may or may not be self-resonating. These also include fiber lasers, disk lasers, non-solid state lasers, etc. Generally, each emitter includes a back reflective surface, at least one optical gain medium, and a front reflective surface. The optical gain medium increases the gain of electromagnetic radiation that is not limited to any particular portion of the electromagnetic spectrum, but that may be visible, infrared, and/or ultraviolet light. An emitter may include or consist essentially of multiple beam emitters such as a diode bar configured to emit multiple beams. The input beams received in the embodiments herein may be single-wavelength or multi-wavelength beams combined using various techniques known in the art.

Embodiments of the invention may be utilized with wavelength beam combining (WBC) systems that include a plurality of emitters, such as one or more diode bars, that are combined using a dispersive element to form a multi-wavelength beam. Each emitter in the WBC system individually resonates, and is stabilized through wavelength-specific feedback from a common partially reflecting output coupler that is filtered by the dispersive element along a beam-combining dimension. Exemplary WBC systems are detailed in U.S. Pat. No. 6,192,062, filed on Feb. 4, 2000, U.S. Pat. No. 6,208,679, filed on Sep. 8, 1998, U.S. Pat. No. 8,670,180, filed on Aug. 25, 2011, and U.S. Pat. No. 8,559,107, filed on Mar. 7, 2011, the entire disclosure of each of which is incorporated by reference herein.

In an aspect, embodiments of the invention feature a beam-parameter adjustment system and focusing system for receiving and altering a spatial distribution of a plurality of radiation beams from a plurality of beam sources and focusing the radiation with the altered spatial distribution onto an end face of an optical fiber. The spatial distribution and the altered spatial distribution may be spatial power distributions. The radiation beams each have a polarization state and collectively have a spatial distribution (e.g., a spatial power distribution). The system includes or consists essentially of a first optical element for splitting each of the radiation beams into a plurality of spatially displaced output beams, the splitting being based on the polarization states, focusing optics (e.g., one or more lenses, mirrors, and/or other optical elements) for combining the output beams onto the optical-fiber end face, and a second optical element for altering a polarization state of (i) at least one of the radiation beams and/or (ii) at least one of each plurality of output beams prior to combination thereof by the focusing optics, whereby the combined output beams have an output spatial distribution different from the spatial distribution of the radiation beams, the output distribution being determined by the polarization-based splitting.

Embodiments of the invention may include one or more of the following in any of a variety of combinations. The second optical element may include or consist essentially of a half-wave plate. The first optical element may include or consist essentially of a polarizing beam splitter for splitting the radiation beams into the output beams in accordance with the polarization states of the radiation beams. The half-wave plate may be optically upstream of the polarizing beam splitter (i.e., positioned such that incoming light strikes the half-wave plate before the polarizing beam splitter). The polarizing beam splitter may have a top reflective surface angled so that the output beams propagate at an off-parallel angle relative to optical paths of the radiation beams. A polarization randomizer for randomizing polarization states of the output beams may be optically upstream of the focusing optics. The polarization randomizer may include or consist essentially of a quarter-wave plate and/or a polarization scrambler. The first optical element may include or consist essentially of a birefringent beam displacer for spatially displacing at least some of the radiation beams based on the polarization states thereof. The beam displacer may be birefringent (e.g., uniaxially birefringent), whereby each of the radiation beams is split into an ordinary beam propagating along an optical axis of the beam displacer and an extraordinary beam propagating away from the optical axis. The power distribution between each of the ordinary and extraordinary beams may depend on polarization components of the corresponding radiation beam. The beam displacer may be wedged so that the output beams propagate at an off-parallel angle relative to optical paths of the radiation beams.

The first optical element may include or consist essentially of first and second polarizing beam splitters. The second optical element may include or consist essentially of a half-wave plate disposed between the first and second polarizing beam splitters along an optical axis thereof. The first polarizing beam splitter may split the radiation beams into a plurality of spatially displaced intermediate beams in accordance with the polarization states of the radiation beams. Some but not all of the intermediate beams may propagate along the optical paths of the radiation beams, and some of the intermediate beams may propagate parallel to but spatially displaced from the optical paths of the radiation beams. The second optical element may intercept and alter polarization states of at least some of the displaced intermediate beams. The second polarizing beam splitter may combine at least some of the displaced intermediate beams with the intermediate beams that have not been displaced based on the altered polarization states of the displaced intermediate beams intercepted by the second optical element. The system may include a quarter-wave plate, optically upstream of the first polarizing beam splitter, for establishing the polarization states of the radiation beams. A rotation angle of the half-wave plate about an optical axis thereof may determine an allocation of beam power between a maximum numerical aperture of the radiation beams and a minimum numerical aperture of the radiation beams.

The first optical element may include or consist essentially of first and second birefringent beam displacers. The second optical element may include or consist essentially of a half-wave plate disposed between the first and second beam displacers along an optical axis thereof. The first beam displacer may displace each of the radiation beams into an ordinary intermediate beam propagating along an optical axis of the beam displacer and an extraordinary intermediate beam propagating away from the optical axis based on the polarization states of the radiation beams. The second optical element may intercept and alter polarization states of the intermediate beams. The second beam displacer may displace the intermediate beams based on the altered polarization states thereof. The system may include a quarter-wave plate, optically upstream of the first polarizing beam splitter, for establishing the polarization states of the radiation beams.

The first optical element may include or consist essentially of first and second spaced-apart, substantially optically transparent plates. The plates may be oriented parallel to each other but angled with respect to optical paths of the radiation beams. The second optical element may include or consist essentially of a half-wave plate intervening between the first and second plates. Each of the first and second plates may have a birefringent surface facing the second optical element and a highly reflective surface opposite the birefringent surface. The rotation angle of the half-wave plate about an optical axis thereof may determine an allocation of beam power between a maximum numerical aperture of the radiation beams and a minimum numerical aperture of the radiation beams.

The first optical element may include or consist essentially of at least one reflector and first and second spaced-apart, substantially optically transparent plates. The plates may be oriented at opposite angles with respect to optical paths of the radiation beams. The second optical element may include or consist essentially of a half-wave plate. Each of the first and second plates may have a birefringent surface facing the second optical element and a highly reflective surface opposite the birefringent surface. The first and second plates may be disposed along the optical paths of the radiation beams. The reflector may be spaced apart from the optical paths of the radiation beams. The half-wave plate may be disposed between the first plate and the reflector. The first and second optical elements may be arranged such that intermediate beams from the first plate travel through the half-wave plate and are reflected by the reflector to the second plate from which they propagate through the focusing optics. The first and second plates may be disposed along the optical paths of the radiation beams. The first and second reflectors may be spaced apart from the optical paths of the radiation beams and oriented at opposite angles with respect to each other. The half-wave plate may be disposed between the reflectors. The first and second optical elements may be arranged such that intermediate beams from the first plate are directed through the half-wave plate by the first reflector and to the second plate by the second reflector so as to propagate through the focusing optics.

In another aspect, embodiments of the invention feature a beam-parameter adjustment system and focusing system for receiving and altering a spatial distribution of a plurality of radiation beams from a plurality of beam sources and focusing the radiation with the altered spatial distribution onto an end face of an optical fiber. The spatial distribution and the altered spatial distribution may be spatial power distributions. The system includes or consists essentially of a deformable mirror, focusing optics, and a controller. The deformable mirror has a reflective surface, and the controller alters a conformation (e.g., shape) of the reflective surface. The deformable mirror and the focusing optics are arranged such that the deformable mirror receives the radiation beams and directs them through the focusing optics onto the end face. The controller is responsive to a target radiation power distribution and configured to produce a mirror conformation causing the radiation beams to strike the end face with the target radiation power distribution.

In yet another aspect, embodiments of the invention feature a beam-parameter adjustment system and focusing system for receiving and altering a spatial power distribution of a radiation beam from a beam source and focusing the radiation with the altered spatial power distribution onto an end face of an optical fiber. The system includes or consists essentially of a gradient-index lens having a refractive index constant through an optical axis of the lens but varying in directions perpendicular to the optical axis, means for introducing a distortion in the lens to vary a waist, spot size, beam quality, entry angle (into the fiber), and/or divergence of a beam emerging from the lens, and a controller for controlling the distortion-introducing means to achieve a target altered spatial power distribution on the end face. The distortion-introducing means may be at least one of a local heater, a radiation source directed into the lens, an acousto-optic modulator and/or transducer altering an optical property of the lens, or an electro-optic modulator and/or transducer altering an optical property of the lens. The reflective surface may have a controllable phase error, the phase error producing the target radiation power distribution.

In another aspect, embodiments of the invention feature a beam-parameter adjustment system and focusing system for receiving and altering a spatial power distribution of a radiation beam from a beam source and focusing the radiation with the altered spatial power distribution onto an end face of an optical fiber. The system includes or consists essentially of focusing optics, a heating source for introducing a heat-dependent distortion in the focusing optics to vary a waist, spot size, beam quality, entry angle (into the fiber), and/or divergence of a beam emerging therefrom, and a controller for controlling the heating source to achieve a target altered spatial power distribution on the end face.

In yet another aspect, embodiments of the invention feature a beam-parameter adjustment system and focusing system for receiving and altering a spatial power distribution of a radiation beam from a beam source and focusing the radiation with the altered spatial power distribution onto an end face of an optical fiber. The system includes or consists essentially of a focusing optics, a fiber end cap optically coupling radiation from the focusing optics into the fiber end face (and which may be butt-coupled, e.g., gaplessly butt-coupled, to the fiber end face), means for introducing a distortion in the fiber end cap to vary a waist, spot size, beam quality, entry angle (into the fiber), and/or divergence of a beam emerging from the focusing optics (and/or the end cap), and a controller for controlling the distortion-introducing means to achieve a target altered spatial power distribution on the end face. The distortion-introducing means may include or consist essentially of at least one of a local heater, a radiation source directed into the end cap, an acousto-optic modulator and/or transducer altering an optical property of the end cap, or an electro-optic modulator and/or transducer altering an optical property of the end cap.

In another aspect, embodiments of the invention feature a beam-parameter adjustment system and focusing system for receiving a radiation beam from a beam source and focusing the radiation onto an end face of an optical fiber. The system may include or consist essentially of focusing optics and a segment of gradient-index fiber for optically coupling radiation from the focusing optics into the fiber end face with an altered spatial power distribution. The segment of gradient-index fiber may be butt-coupled to the end face.

In yet another aspect, embodiments of the invention feature a beam-parameter adjustment system and focusing system for altering a spatial power distribution of a plurality of radiation beams. The system may include or consist essentially of a plurality of beam sources for emitting radiation beams (e.g., laser beams), focusing optics (e.g., at least one focusing lens) for focusing radiation from the beam sources onto the end face of an optical fiber, and a beam pathway adjuster for shifting the beams to achieve a target spatial power distribution on the end face. The beam pathway adjuster may alter a spacing between the beams from the beam sources to achieve the target spatial power distribution. The beam pathway adjuster may shift at least some of the beams relative to the focusing optics to achieve the target spatial power distribution. The system may include means for selectively altering a power of at least one of the beams (e.g., a controller for modulating power into and/or out of at least one beam emitter) to achieve the target spatial power distribution.

In another aspect, embodiments of the invention feature a beam-parameter adjustment system and focusing system for receiving and altering a spatial power distribution of a radiation beam from a beam source and focusing the radiation with the altered spatial power distribution onto an end face of an optical fiber. The system includes or consists essentially of an acousto-optic element, a first acoustic transducer, focusing optics, and a controller. The acousto-optic element receives the radiation beam and diffracts the radiation beam into a plurality of different orders (i.e., diffraction orders). The first acoustic transducer generates sound waves within the acousto-optic element, thereby altering an index of refraction of at least a portion of the acousto-optic element in a periodic pattern. The focusing optics receive the plurality of orders from the acousto-optic element and focus the orders on the end face. The controller controls the first acoustic transducer and/or the acousto-optic element to achieve a target altered spatial power distribution on the end face.

Embodiments of the invention may include one or more of the following in any of a variety of combinations. The system may include collimating optics for collimating the diffracted orders. The collimating optics may be disposed optically downstream of the acousto-optic element and/or optically upstream of the focusing optics. The controller may be configured to vary an angle between a surface of the acousto-optic element and the received radiation beam. The system may include one or more additional acoustic transducers each for generating sound waves within the acousto-optic element, thereby altering an index of refraction of a different portion of the acousto-optic element in a periodic pattern. The radiation beam may be a multi-wavelength beam.

In another aspect, embodiments of the invention feature a beam-parameter adjustment system and focusing system for receiving and altering a spatial power distribution of a radiation beam from a beam source and focusing the radiation with the altered spatial power distribution onto an end face of an optical fiber. The system includes or consists essentially of focusing optics, a variable refractive index component, and a controller. The focusing optics focus the radiation beam toward the end face at a focal point, and the focal point is not necessarily disposed on the end face. The variable refractive index component is disposed optically downstream of the focusing optics. The controller controls a refractive index of the variable refractive index component to vary the focal point and achieve a target altered spatial power distribution on the end face.

Embodiments of the invention may include one or more of the following in any of a variety of combinations. The variable refractive index component may include or consist essentially of an electro-optic material. The controller may control the refractive index of the variable refractive index component via application of an electric field. The variable refractive index component may include or consist essentially of a gaseous material (e.g., within a substantially transparent container). The controller may control the refractive index of the variable refractive index component by altering a temperature, flow rate, and/or density of the gaseous material. The radiation beam may be a multi-wavelength beam.

In yet another aspect, embodiments of the invention feature a laser delivery system for receiving and altering a spatial power distribution of a radiation beam from a beam source and focusing the radiation with the altered spatial power distribution onto a workpiece. The system includes or consists essentially of a first acousto-optic element, a first acoustic transducer, focusing optics, and a controller. The first acousto-optic element receives the radiation beam and alters a beam quality of the radiation beam along a first direction. The first acoustic transducer generates sound waves within the first acousto-optic element, thereby altering an index of refraction of at least a portion of the first acousto-optic element in a periodic pattern. The focusing optics receive the altered beam and focus the altered beam on (or on or proximate the surface of) the workpiece. The controller controls the first acoustic transducer and/or the first acousto-optic element to achieve a target altered spatial power distribution on the workpiece.

Embodiments of the invention may include one or more of the following in any of a variety of combinations. The system may include a second acousto-optic element for receiving the radiation beam and altering a beam quality of the radiation beam along a second direction different from the first direction. The system may include a second acoustic transducer for generating sound waves within the second acousto-optic element, thereby altering an index of refraction of at least a portion of the second acousto-optic element in a periodic pattern. The controller may be configured to control the second acoustic transducer and/or the second acousto-optic element to achieve the target altered spatial power distribution on the workpiece. The first direction may be substantially orthogonal to the second direction. The system may include collimating optics for collimating the radiation beam. The collimating optics may be disposed optically upstream of the first acousto-optic element. The system may include a second acoustic transducer for generating sound waves within the first acousto-optic element in a second direction different from the first direction, thereby altering an index of refraction of at least a portion of the first acousto-optic element in a periodic pattern. The first acousto-optic element may alter a beam quality of the radiation beam along the second direction. The controller may be configured to control the second acoustic transducer to achieve the target altered spatial power distribution on the workpiece. The first direction may be substantially orthogonal to the second direction. The radiation beam may be a multi-wavelength beam.

These and other objects, along with advantages and features of the present invention herein disclosed, will become more apparent through reference to the following description, the accompanying drawings, and the claims. Furthermore, it is to be understood that the features of the various embodiments described herein are not mutually exclusive and may exist in various combinations and permutations. As used herein, the term "substantially" means ±10%, and in some embodiments, ±5%. The term "consists essentially of" means excluding other materials that contribute to function, unless otherwise defined herein. Nonetheless, such other materials may be present, collectively or individually, in trace amounts. Herein, the terms "radiation" and "light" are utilized interchangeably unless otherwise indicated.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 3A and 3B are schematic diagrams of laser systems incorporating graded-index lenses in accordance with various embodiments of the invention;

FIGS. 4A and 4B are schematic diagrams of laser systems incorporating adjustable lenses in accordance with various embodiments of the invention;

FIGS. 6A and 6B are schematic diagrams of laser systems incorporating graded-index in-coupling fibers in accordance with various embodiments of the invention;

FIGS. 8A and 8B are schematic diagrams of laser systems incorporating deformable mirrors and multiple input beams in accordance with various embodiments of the invention;

FIGS. 9A and 9B are schematic diagrams of laser systems incorporating multiple input beams with adjustable spacings in accordance with various embodiments of the invention;

FIGS. 10A and 10B are schematic diagrams of laser systems incorporating multiple variable-power input beams in accordance with various embodiments of the invention;

FIGS. 11E-11H are schematic diagrams of laser systems in which input beam quality is adjusted on the basis of polarization in accordance with various embodiments of the invention;

FIGS. 11I and 11J are schematic diagrams of laser systems in which input beam quality is adjusted on the basis of polarization and that are utilized with multi-cladding optical fibers in accordance with various embodiments of the invention;

FIG. 11K is a schematic plot of spatial power distribution within a multi-cladding optical fiber utilized with the laser systems of FIG. 11I or FIG. 11J;

DETAILED DESCRIPTION

Figure 1:
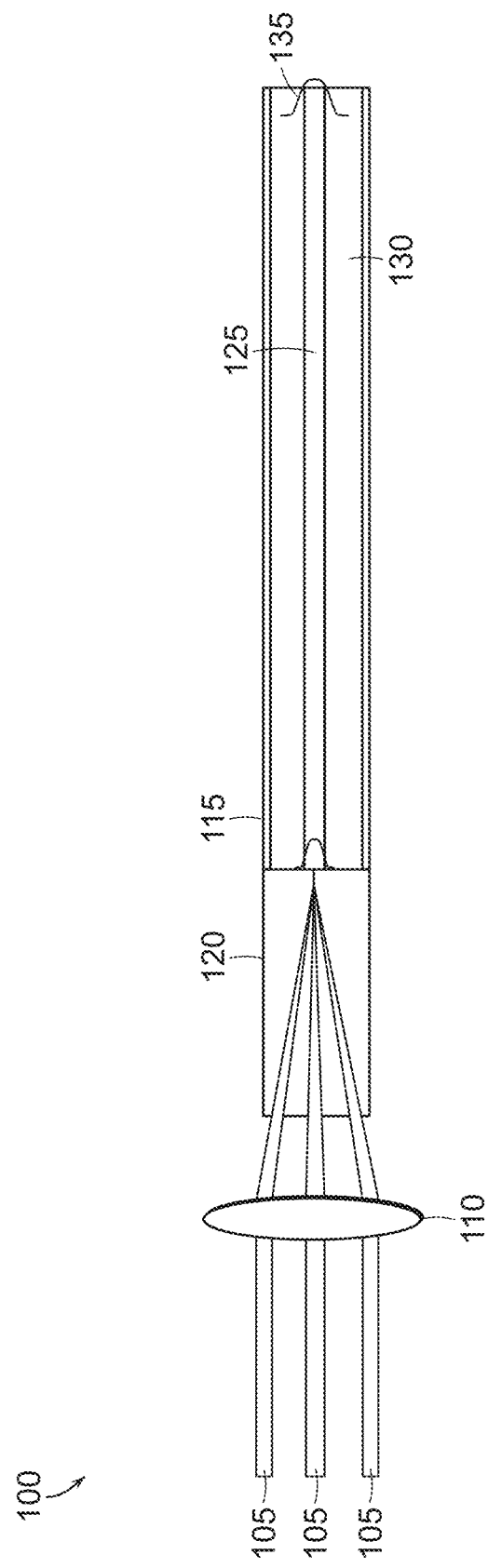
FIG. 1 is a schematic diagram of a laser system in accordance with various embodiments of the invention.

FIG. 1 is a schematic diagram of a laser system 100 in accordance with various embodiments of the present invention. In the laser system 100, one or more input beams 105 are focused via a focusing lens 110 into an optical fiber 115 having a fiber end cap 120. The end cap 120 may be, for example, a piece of "coreless" (i.e., substantially homogeneous) or graded-index (i.e., having a graded index of refraction) glass, and the end cap 120 may advantageously reduce the optical intensity at the glass-air interface for a given optical power and/or protect the fiber 115 from environmental damage (e.g., moisture). As shown, the optical fiber 115 may have one or more cores 125 surrounded by one or more cladding layers 130. For laser system 100, the BPP of the input beam or beams 105 is defined as $(x/2) \times \theta = (x \times d)/(4 \times f)$, where x is the diameter (or "beam size") of the input beam 105, $\theta$ is the laser beam divergence (or "beam divergence") of the input beam 105, d is the focused diameter of the focused input beam 105, and f is the focal length of the focusing lens 110. The beam size is typically calculated in terms of the "second moment width" or "D4σ width," where the D4σ width of a beam in the horizontal or vertical direction is 4 times σ, where σ is the standard deviation of the horizontal or vertical marginal distribution, respectively. An optical fiber 110 having a single core 125 and a single cladding layer 130 may be assumed to have a core diameter of d' and a cladding diameter of D'.

Once the one or more input beams 105 are coupled into the optical fiber 115, the fiber 115 outputs an output beam 135. The BPP of the output beam 135 (or "output BPP") may be defined as $(d''/2) \times NA''$, where NA" is the numerical aperture of the fiber 115 and d" is the output beam size. The output beam size d" depends on the relative amounts of the beam propagating within the cladding 130 and within the core 125 (or, equivalently, the "power content ratio" of the cladding 130 to the core 125). For example, the output BPP may be minimized by minimizing the amount of the beam within the cladding 130, and the output BPP may be maximized by minimizing the amount of the beam within the core 125. Thus, the output BPP may be adjusted to a desired value by focusing different amounts of the input beam(s) within the different regions of the fiber 115. In general, the fiber 115 maintains the entry angle (or divergence or numerical aperture) of input light within the output beam; thus, the output BPP may be advantageously varied via variation of the input beam quality (or BPP).

Figure 2A:
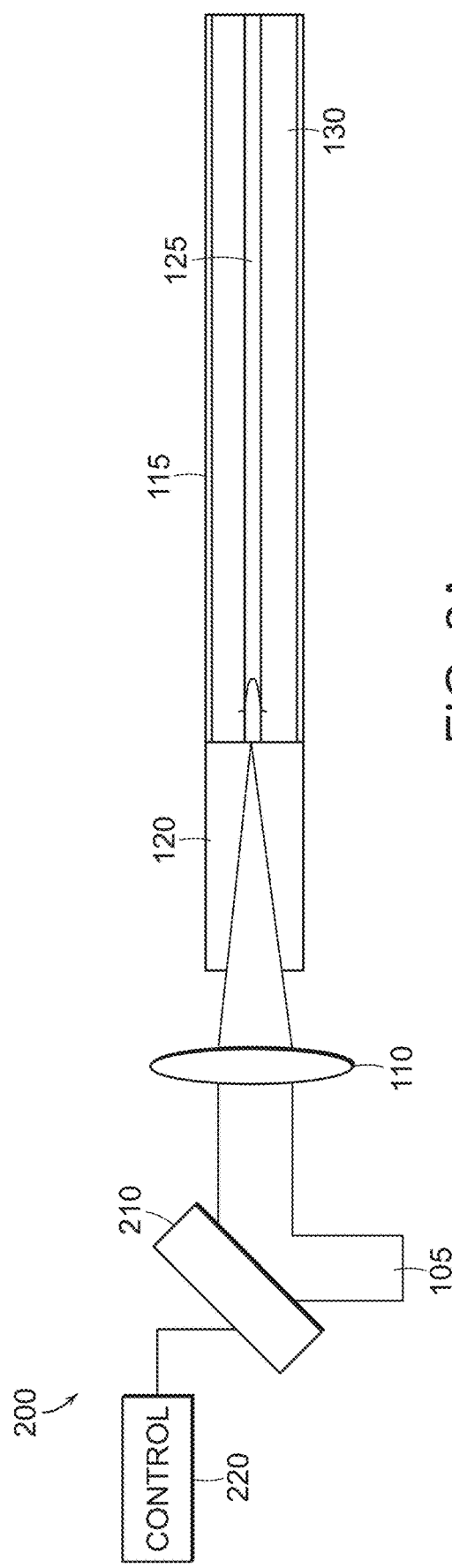
FIGS. 2A-2C are schematic diagrams of laser systems incorporating deformable mirrors in accordance with various embodiments of the invention.
Figure 2B:
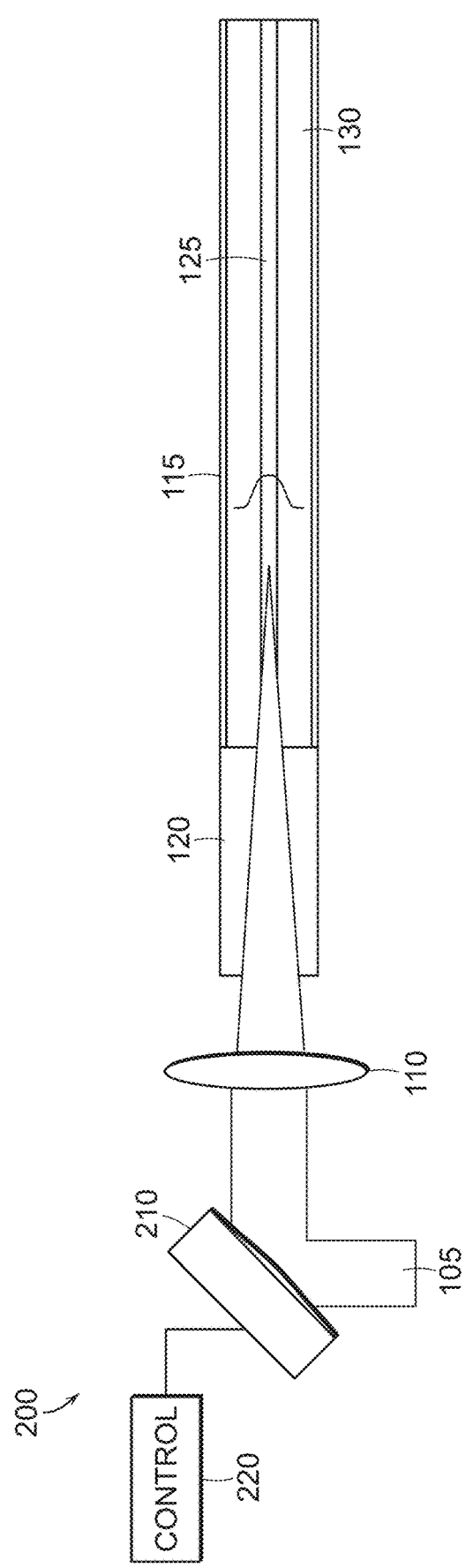

Referring to FIGS. 2A and 2B, in an exemplary laser system 200 in accordance with various embodiments of the present invention, a deformable mirror 210 is utilized to alter the point at which one or more input beams 105 are focused into the optical fiber 115. As shown in FIG. 2A, in a nominal condition, the input beam(s) 105 are focused by the deformable mirror 210 and the focusing lens 110 into the core 125 of the fiber 115, thus minimizing the output BPP. As shown in FIG. 2B, the deformable mirror 210 may be manipulated (e.g., by altering the angle of one or more points on its surface) such that the input beam 105 is focused such that a fraction of the light spills over into the cladding 130, increasing the output BPP. Similarly, the deformable mirror 210 may be utilized to focus all or part of the focused input beam 105 into a core other than core 125 when the fiber 115 is a multi-core optical fiber. As known in the art, the deformable mirror 210 may include or consist essentially of, for example, a segmented mirror formed by independent flat mirror segments. Each segment may move a small distance back and forth and/or tilt in one or more directions, in response to an actuator, to alter the wavefront of incoming light. Other exemplary deformable mirrors 210 include continuous-faceplate mirrors including or consisting essentially of a continuous membrane deformable by any of an array of actuators located at the back surface of the membrane.

As shown in FIGS. 2A and 2B, the deformable mirror 210 and/or the array of actuators deforming portions thereof are responsive to a controller 220, which thereby alters a conformation of the reflective surface of the deformable mirror 210. The controller 220 is responsive to a desired target radiation power distribution (e.g., input by a user) and configured to produce a mirror conformation causing the input beams to strike the end face of fiber 115 with the target radiation power distribution. The controller 220 may be programmed to achieve the desired power distribution (and thus the desired output BPP) via a particular mirror surface conformation without undue experimentation by one of skill in the art. The controller 220 may be provided as either software, hardware, or some combination thereof. For example, the system may be implemented on one or more conventional server-class computers, such as a PC having a CPU board containing one or more processors such as the Pentium or Celeron family of processors manufactured by Intel Corporation of Santa Clara, Calif., the 680×0 and POWER PC family of processors manufactured by Motorola Corporation of Schaumburg, Ill., and/or the ATHLON line of processors manufactured by Advanced Micro Devices, Inc., of Sunnyvale, Calif. The processor may also include a main memory unit for storing programs and/or data relating to the methods described above. The memory may include random access memory (RAM), read only memory (ROM), and/or FLASH memory residing on commonly available hardware such as one or more application specific integrated circuits (ASIC), field programmable gate arrays (FPGA), electrically erasable programmable read-only memories (EEPROM), programmable read-only memories (PROM), programmable logic devices (PLD), or read-only memory devices (ROM). In some embodiments, the programs may be provided using external RAM and/or ROM such as optical disks, magnetic disks, as well as other commonly used storage devices. For embodiments in which the functions are provided as one or more software programs, the programs may be written in any of a number of high level languages such as FORTRAN, PASCAL, JAVA, C, C++, C#, BASIC, various scripting languages, and/or HTML. Additionally, the software may be implemented in an assembly language directed to the microprocessor resident on a target computer; for example, the software may be implemented in Intel 80×86 assembly language if it is configured to run on an IBM PC or PC clone. The software may be embodied on an article of manufacture including, but not limited to, a floppy disk, a jump drive, a hard disk, an optical disk, a magnetic tape, a PROM, an EPROM, EEPROM, field-programmable gate array, or CD-ROM.

Figure 2C:
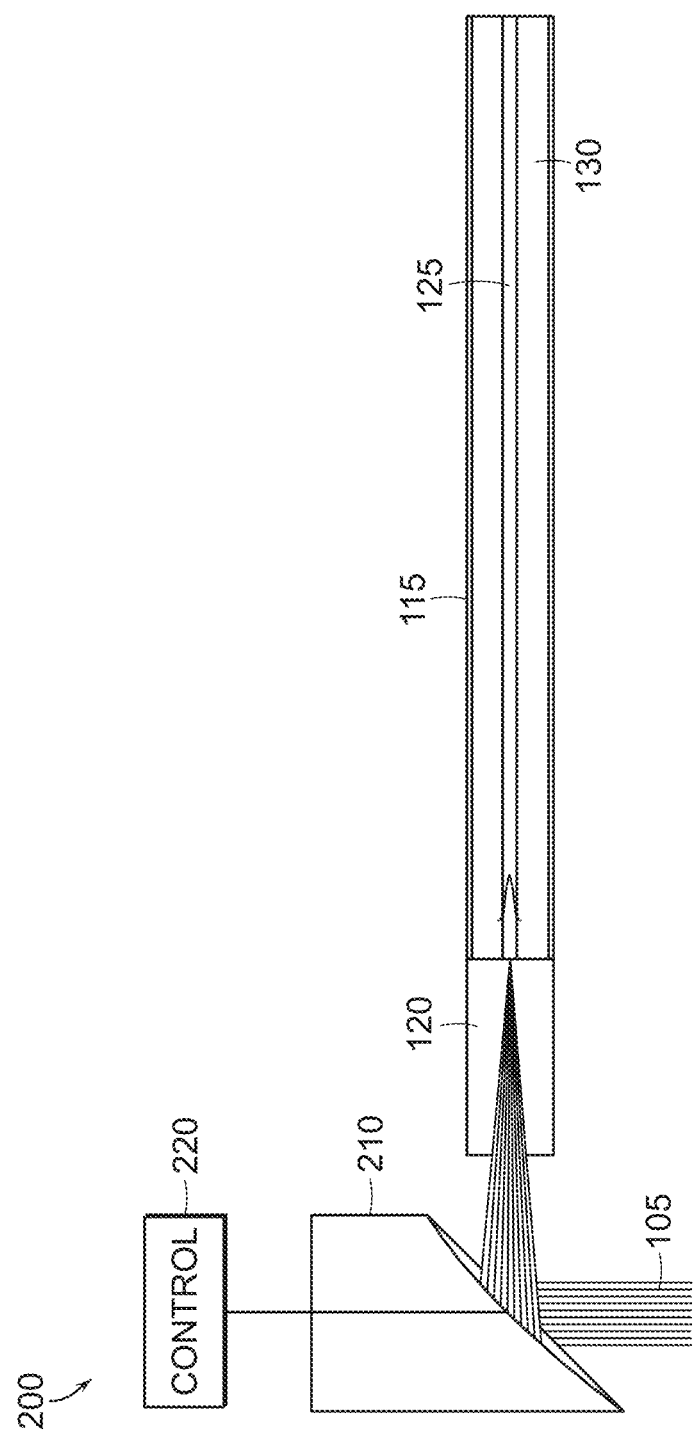

As shown in FIG. 2C, the deformable mirror 210 may be parabolic (i.e., have a reflecting surface all or a portion of which is substantially parabolic), and such deformable mirrors themselves may focus (even without a separate focusing lens 110) one or more input beams 105 (all or portions of each of which may be manipulated via alterations of the surface of the deformable mirror 210) to a variety of regions of fiber 115, depending upon the desired output BPP of the laser system 200.

Referring to FIGS. 3A and 3B, in an exemplary laser system 300 in accordance with various embodiments of the present invention, a graded-index (or "GRIN") lens 310 is utilized to alter the point at which one or more input beams 105 are focused into the optical fiber 115 and/or the spot size of the focused beam(s). As shown in FIG. 3A, in a nominal condition, the input beam(s) 105 are focused by the GRIN lens 310 into the core 125 of the fiber 115, thus minimizing the output BPP. In the nominal condition of FIG. 3A, as shown, the input beam(s) 105 propagate within the GRIN lens 310 such that the spot size of the input beam(s) 105 at the interface between the GRIN lens 310 and the fiber 115 is minimized and directed into the core 125. As shown in FIG. 3B, the GRIN lens 310 may be manipulated (or "disturbed" or "perturbed," indicated by arrows 320) such that the spot size of the input beam(s) 105 at the interface between the GRIN lens 310 and the fiber 115 is altered (e.g., larger). As shown, in the condition depicted in FIG. 3B, a fraction of the incoming light is coupled into the cladding 130 (or into another core and/or cladding in multiple-core and/or multiple-cladding fibers), thereby increasing the output BPP. In various embodiments, when the GRIN lens 310 is disturbed, one or more optical properties (e.g., refractive index) change in at least a portion of the GRIN lens 310. For example, the GRIN lens 310 may be disturbed via local heating of a portion of the lens and/or local absorption of radiation in a portion of the lens. In some embodiments, all or a portion of the GRIN lens 310 includes or consists of a material exhibiting the acousto-optic effect, and an acoustic transducer may be utilized to alter the optical properties of the GRIN lens 310. For example, the GRIN lens 310 may include or consist essentially of fused silica, lithium niobate, arsenic trisulfide, tellurium dioxide, tellurite glass, lead silicate, and/or another acousto-optical material. Similarly, an electric field may be applied to a GRIN lens 310 exhibiting the electro-optic effect to alter its refractive index, thereby disturbing the lens sufficiently to alter the output BPP.

As shown in FIG. 3B, the means for introducing a distortion in the GRIN lens 310 (e.g., at least one of a local heater, a radiation source directed into the lens, an acousto-optic modulator and/or transducer altering an optical property of the lens, or an electro-optic modulator and/or transducer altering an optical property of the lens) is responsive to a controller 220. Controller 220 may be conventional, and may be configured to introduce and/or control the distortion-inducing means in response to a desired output BPP without undue experimentation.

Referring to FIGS. 4A and 4B, in an exemplary laser system 400 in accordance with various embodiments of the present invention, an adjustable focusing lens 410 is utilized to alter the point at which one or more input beams 105 are focused into the optical fiber 115 and/or the spot size of the focused beam(s) via, e.g., manipulation of the lens 410 to alter its focal point. As shown in FIG. 4A, in a nominal condition, the input beam(s) 105 are focused by the adjustable lens 410 into the core 125 of the fiber 115, thus minimizing the output BPP. In the nominal condition of FIG. 4A, as shown, the input beam(s) 105 are focused such that the focal point is disposed at the interface between the end cap 120 and the fiber 115; thus, the spot size of the input beam(s) is minimized and directed into the core 125. As shown in FIG. 4B, the adjustable lens 410 may be manipulated (or "disturbed" or "perturbed") such that the focal length of the lens 410 changes. For example, as shown in FIG. 4B, the focal length may be decreased such that the input beams are focused at a point within the bulk of the end cap 120, thereby increasing the spot size at the interface between the end cap 120 and the fiber 115. Thus, in the condition depicted in FIG. 4B, a fraction of the incoming light is coupled into the cladding 130 (or into another core and/or cladding in multiple-core and/or multiple-cladding fibers), thereby increasing the output BPP. The adjustable lens 410 may be perturbed by, e.g., application of heat to the lens 410 from a heating source 420. As shown, the heating source 420 is responsive to a controller 220. Controller 220 may be conventional, and may be configured to introduce heat and/or control the heating level provided by the heating source 420 in response to a desired output BPP without undue experimentation.

Figure 5A:
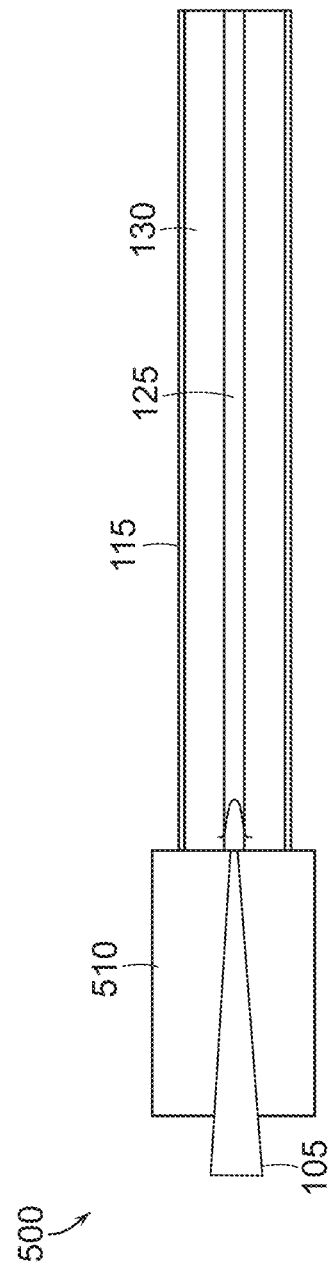
FIGS. 5A and 5B are schematic diagrams of laser systems incorporating adjustable end caps in accordance with various embodiments of the invention.
Figure 5B:
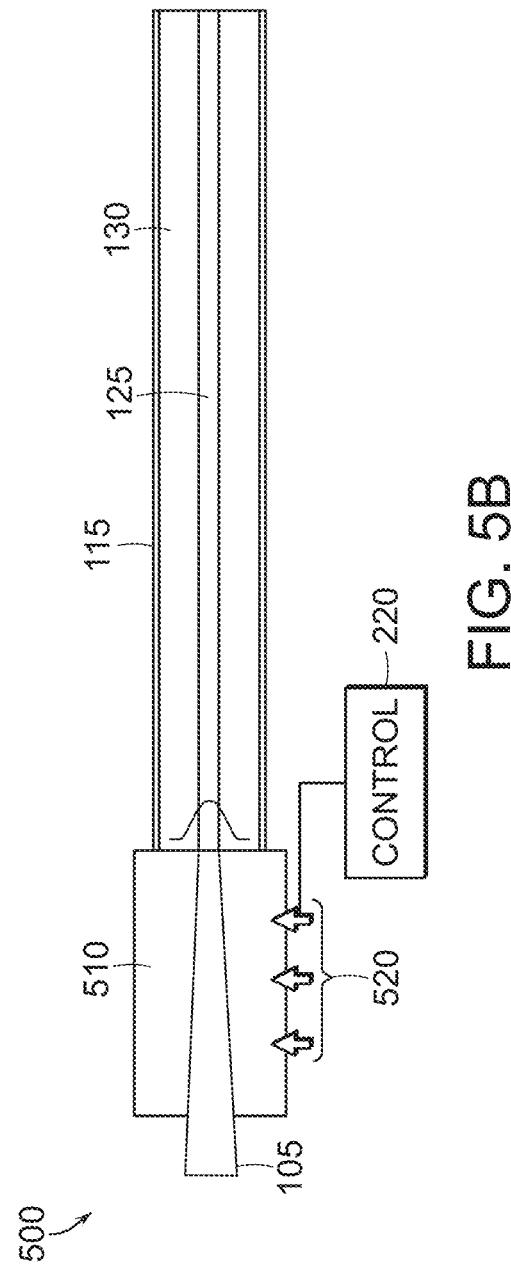

Referring to FIGS. 5A and 5B, in an exemplary laser system 500 in accordance with various embodiments of the present invention, an adjustable end cap 510 is utilized to alter the point at which one or more input beams 105 are focused into the optical fiber 115 and/or the spot size of the focused beam(s) via, e.g., manipulation of the end cap 510 to alter its optical properties (e.g., refractive index). As shown in FIG. 5A, in a nominal condition, the input beam(s) 105 are focused by a lens (not shown) into the end cap 510 and into the core 125 of the fiber 115, thus minimizing the output BPP. In the nominal condition of FIG. 5A, as shown, the input beam(s) 105 are focused such that the focal point is disposed at the interface between the end cap 120 and the fiber 115; thus, the spot size of the input beam(s) is minimized and directed into the core 125. As shown in FIG. 5B, the adjustable end cap 510 may be manipulated (or "disturbed" or "perturbed") such that the focal point of the input beam(s) changes. For example, as shown in FIG. 5B, the focal point may be moved to a point within the optical fiber 115, thereby increasing the spot size at the interface between the end cap 510 and the fiber 115. Thus, in the condition depicted in FIG. 5B, a fraction of the incoming light is coupled into the cladding 130 (or into another core and/or cladding in multiple-core and/or multiple-cladding fibers), thereby increasing the output BPP. The adjustable end cap 510 may be perturbed by, e.g., application of heat and/or pressure to the end cap 510.

As shown in FIG. 5B, the means 520 for introducing a distortion in the fiber end cap 510 (e.g., at least one of a local heater, a radiation source directed into the end cap, an acousto-optic modulator and/or transducer altering an optical property of the end cap, or an electro-optic modulator and/or transducer altering an optical property of the end cap) is responsive to a controller 220. Controller 220 may be conventional, and may be configured to introduce and/or control the distortion-inducing means in response to a desired output BPP without undue experimentation.

Referring to FIGS. 6A and 6B, in an exemplary laser system 600 in accordance with various embodiments of the present invention, a graded-index (or "gradient-index" or "gradient") optical fiber is utilized to alter the spot size of the input beam(s) 105 at the inlet of the optical fiber 115. As known in the art, a gradient-index fiber is an optical fiber whose core has a refractive index that decreases with increasing radial distance from the optical axis of the fiber. Because parts of the core closer to the fiber axis have a higher refractive index than the parts near the cladding, light rays follow sinusoidal paths down the gradient-index fiber. The refractive index profile within the graded-index fiber 610 may be, for example, substantially parabolic. Thus, the spot size of the beam propagated through the gradient-index fiber 610 may be controlled via control of the numerical aperture of the input beam coupled into the gradient-index fiber 610, for example using one of the numerical-aperture-altering techniques described herein. As shown in FIG. 6A, one or more input beams 105 having a small numerical aperture (i.e., a small divergence) will propagate through the gradient fiber 610 and produce a small spot size focused such that substantially all of the beam is coupled into the core 125 of the fiber 115. As shown in FIG. 6B, one or more input beams 105 having a larger numerical aperture (i.e., a larger divergence) will propagate through the gradient fiber 610 and produce a larger spot size focused such that a portion of the beam is coupled into the cladding 130 of the fiber 115, thereby altering (here increasing) the output BPP. The gradient fiber 610 may have a length of, for example, less than approximately 100 mm.

Figure 7A:
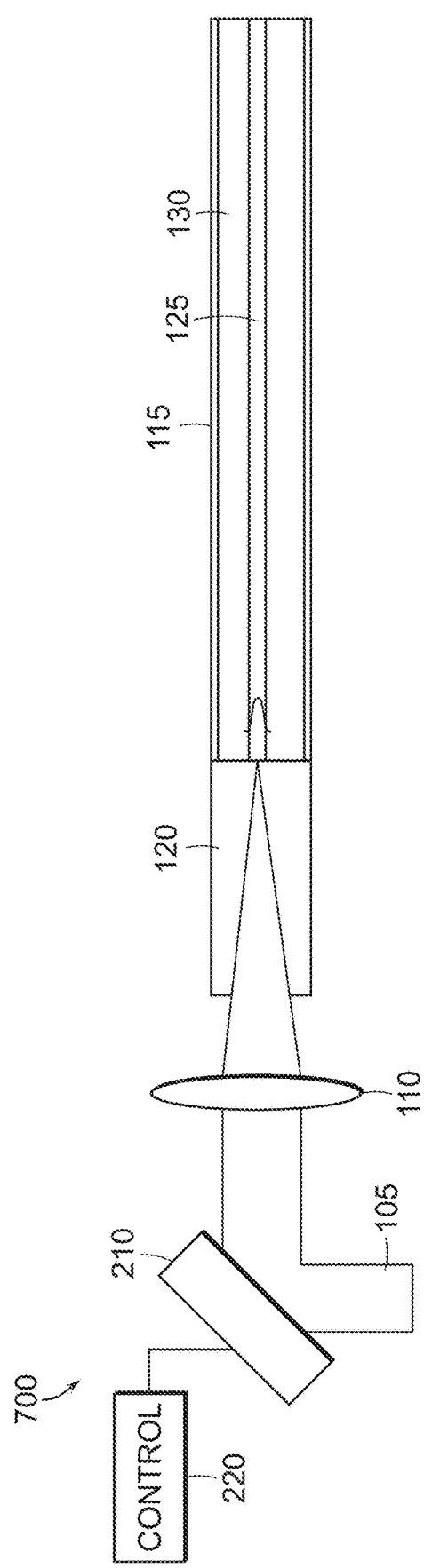
FIGS. 7A and 7B are schematic diagrams of laser systems incorporating deformable mirrors in accordance with various embodiments of the invention.
Figure 7B:
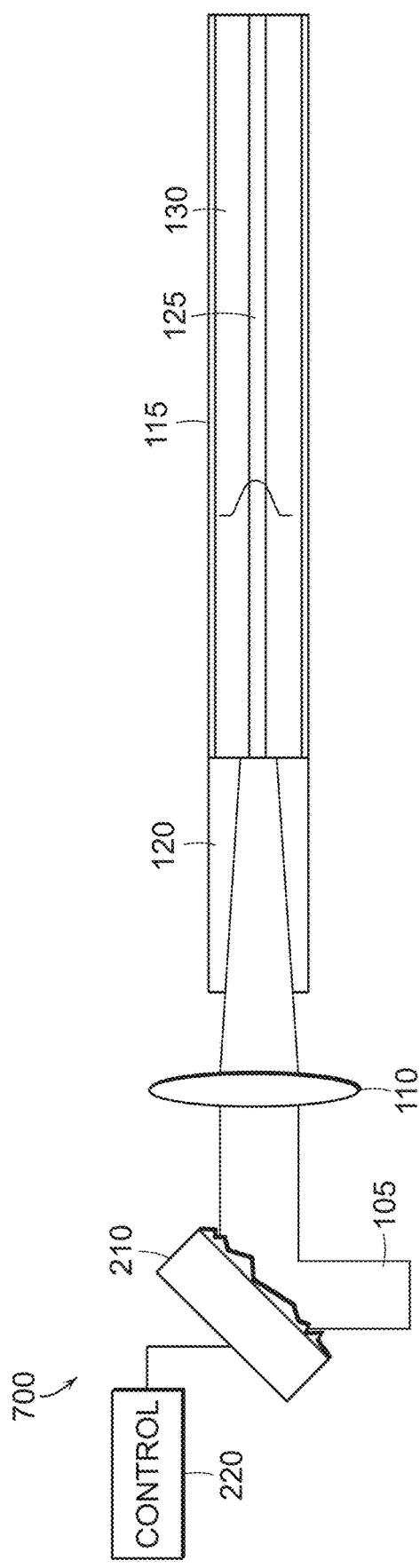

In accordance with various embodiments of the present invention, the output BPP of a laser system may be variably controlled via control of the input wavefront distribution (i.e., the input beam quality) such that at least a portion of the light coupled into an optical fiber is induced to propagate within one or more cladding layers, rather than the core of the fiber (and/or within another core of the fiber, for fibers having multiple cores). For example, FIGS. 7A and 7B depict an exemplary laser system 700 in accordance with various embodiments of the present invention, in which a deformable mirror 210 is utilized to alter the point at which one or more input beams 105 is focused into the optical fiber 115. As shown in FIG. 7A, in a nominal condition, the input beam(s) 105 are focused by the deformable mirror 210 and the focusing lens 110 into the core 125 of the fiber 115, thus minimizing the output BPP. As shown in FIG. 7B, the deformable mirror 210 may be manipulated (e.g., by altering the angle and/or height of one or more points on its surface) such that phase error is introduced into the input beam 105. The phase error changes the beam quality of the input beam 105, and thus, a fraction of the light spills over into the cladding 130, increasing the output BPP.

As shown in FIGS. 7A and 7B, the deformable mirror 210 and/or the array of actuators deforming portions thereof are responsive to a controller 220, which thereby alters a conformation of the reflective surface of the deformable mirror 210 to introduce phase error into the input beam. The controller 220 may be programmed to achieve the desired phase error (and thus the desired output BPP) via a particular mirror surface conformation without undue experimentation by one of skill in the art.

While the laser systems described above (and all laser systems described herein, unless otherwise indicated) may be utilized with a single input beam or multiple input beams, various embodiments of the present invention advantageously utilize multiple input beams to controllably vary the output BPP of the laser system. FIGS. 8A and 8B depict an exemplary laser system 800 in which a deformable mirror 210 is utilized in conjunction with multiple input beams. FIGS. 8A and 8B depict the use of three input beams 105-1, 105-2, 105-3, but embodiments of the invention may utilize two input beams or more than three input beams, as desired. In laser system 800, the deformable mirror 210 is utilized to alter the point at which one or more of the input beams 105 is focused into the optical fiber 115. As shown in FIG. 8A, in a nominal condition, the input beams 105-1, 105-2, 105-3 are focused by the deformable mirror 210 and the focusing lens 110 to a single focal point and into the core 125 of the fiber 115, thus minimizing the output BPP. As shown in FIG. 8B, the deformable mirror 210 may be manipulated (e.g., by altering the angle and/or height of one or more points on its surface) such that phase error is introduced into the input beam 105-3. The phase error changes the trajectory of the input beam 105-3 as it propagates to and through the focusing lens 110, and thus, the input beam 105-3 is focused to a point different from the focus point of input beams 105-1, 105-2. Thus, at least a portion of the light of input beam 105-3 enters the optical fiber 115 at a point different from that where the light from input beams 105-1, 105-2 enters the fiber, thereby increasing the BPP of the combined output beam. For example, as shown in FIG. 8B, the light of input beam 105-3 may be focused onto the cladding layer 130 (or one or more cladding layers, for multi-clad fibers, and/or one or more other cores, for multi-core fibers), while the light of input beams 105-1, 105-2 may be focused onto the core 125.

As shown in FIGS. 8A and 8B, the deformable mirror 210 and/or the array of actuators deforming portions thereof are responsive to a controller 220, which thereby alters a conformation of the reflective surface of the deformable mirror 210 to introduce phase error into one or more of the input beams. The controller 220 may be programmed to achieve the desired phase error (and thus the desired output BPP) via a particular mirror surface conformation without undue experimentation by one of skill in the art.

The beam quality of the input beams may also be changed (thereby enabling controllable variation of output BPP) via alteration of the spacing between the various input beams. FIGS. 9A and 9B depict an exemplary laser system 900 in which the spacing between the input beams 105-1, 105-2, 105-3 is varied to change the input beam quality (i.e., the divergence) coupled into the optical fiber 115. FIG. 9A depicts the input beams 105-1, 105-2, 105-3 being separated by a relatively narrow spacing 910-1, which results in the input beams being focused into the fiber 115 by focusing lens 110 with a relatively small divergence angle 920-1. The relatively small entrance angle into the fiber 115 results in a smaller output BPP. FIG. 9B depicts the input beams 105-1, 105-2, 105-3 being separated by a spacing 910-2 larger than the spacing 910-1, which results in the input beams being focused into the fiber 115 by focusing lens 110 with a divergence angle 920-2 larger than divergence angle 920-1. The larger entrance angle into the fiber 115 results in a larger output BPP. In this manner, the output BPP of laser system 900 may be varied by varying the spacing between the input beams coupled into the fiber 115. In general, the spacing between the input beams may be varied such that the divergence angle of the focused beams entering the fiber does not exceed the acceptance angle of fiber 115. In various embodiments, the acceptance angle $\theta_{accept}$ of fiber 115 may be calculated by the equation: $n \sin \theta_{accept} = \sqrt{n_{core}^2 - n_{clad}^2}$, where n is the index of refraction of the medium from which the light beam is entering the fiber (for example, the index of refraction of air or of the end cap 120), $n_{core}$ is the index of refraction of the core (or of the central optical axis) of the fiber, and $n_{clad}$ is the index of refraction of the cladding of the fiber.

Figure 9D:
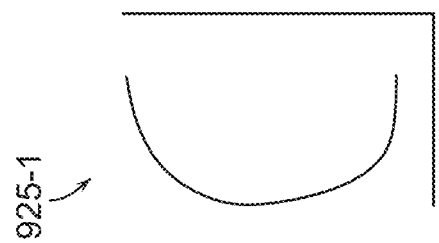
FIG. 9D is a schematic profile of the output beam of the laser system of FIG. 9A.
Figure 9C:
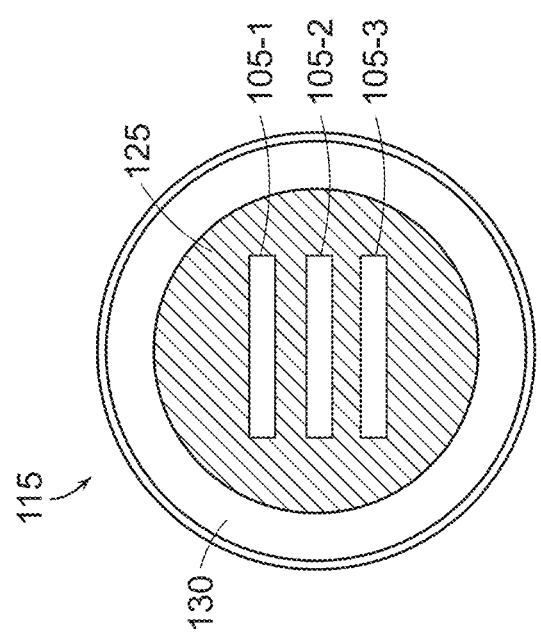
FIG. 9C is a schematic diagram of the input beams at the focusing lens of the laser system of FIG. 9A.

FIG. 9C is a schematic diagram of the three input beams at the focusing lens of the laser system 900 of FIG. 9A, in which the input beams 105-1, 105-2, 105-3 are initially separated by a smaller spacing 910-1. As shown, upon entry into the fiber 115, the three input beams are relatively closely spaced together, reducing (or even minimizing) the output BPP of the laser system. FIG. 9D shows one exemplary profile of an output beam of the laser system 900 of FIG. 9A.

Figure 9F:
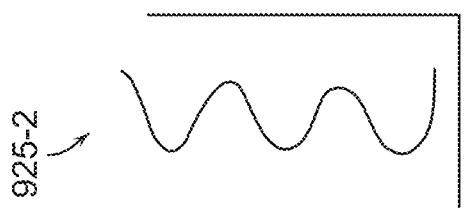
FIG. 9F is a schematic profile of the output beam of the laser system of FIG. 9B.
Figure 9E:
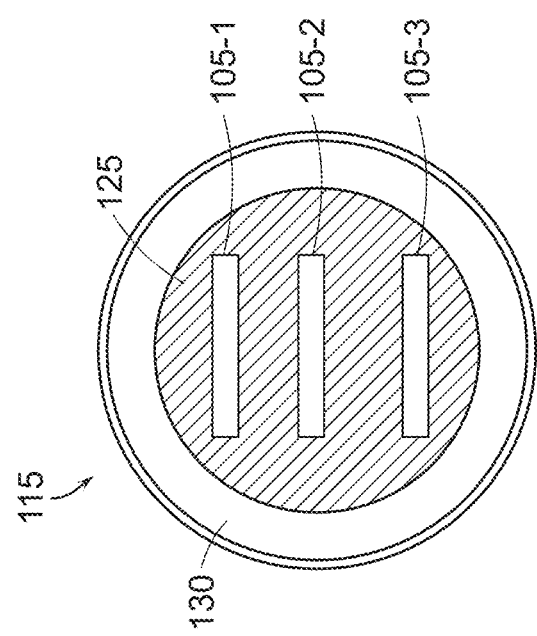
FIG. 9E is a schematic diagram of the input beams at the focusing lens of the laser system of FIG. 9B.

In contrast, FIG. 9E is a schematic diagram of the three input beams at the focusing lens of the laser system 900 of FIG. 9B, in which the input beams 105-1, 105-2, 105-3 are initially separated by the larger spacing 910-2. As shown, upon entry into the fiber 115, the three input beams are relatively farther apart, increasing the output BPP of the laser system. FIG. 9F shows an exemplary profile of an output beam of the laser system 900 of FIG. 9B.

Figure 9G:
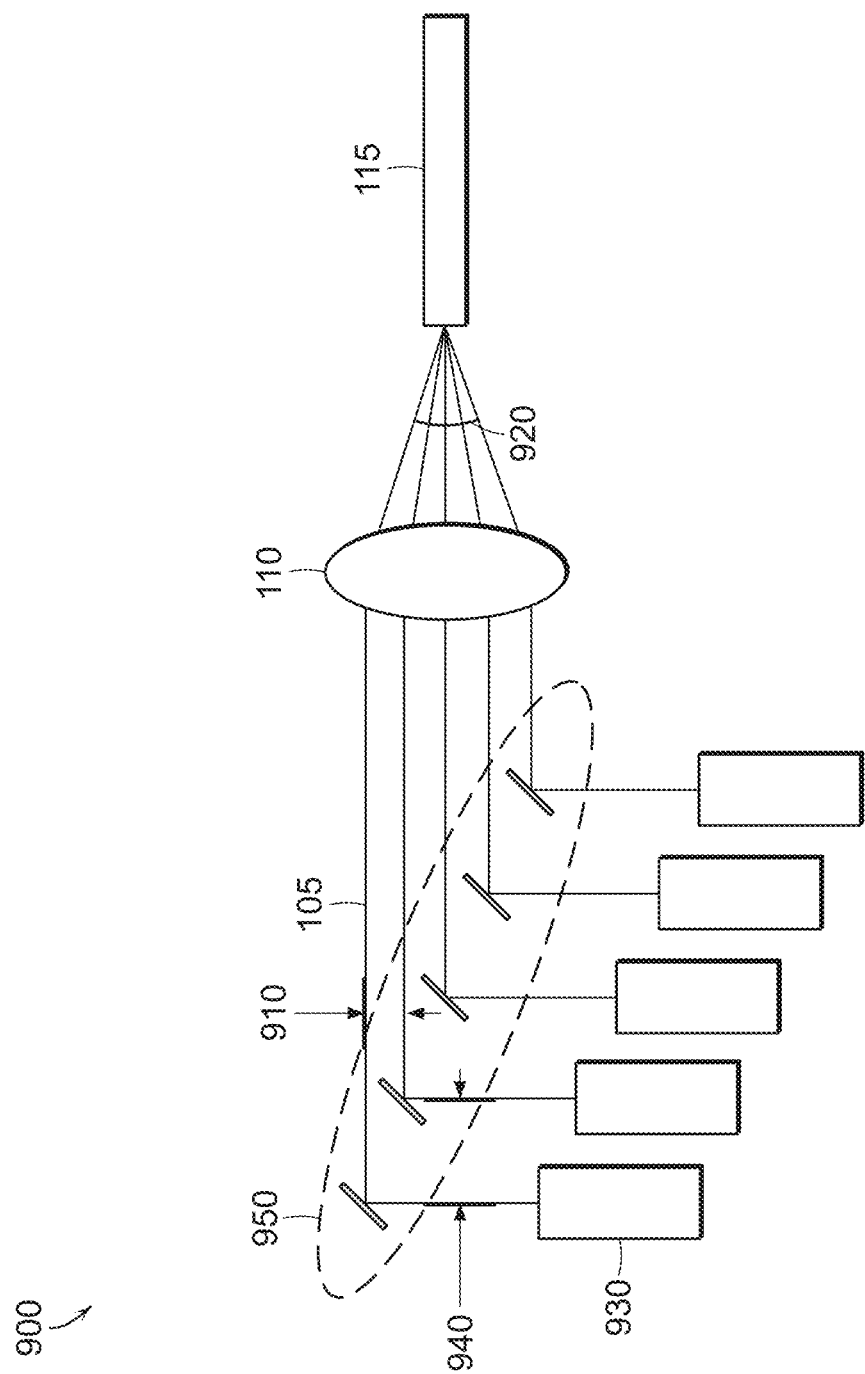
FIG. 9G is a schematic diagram of a laser system incorporating redirecting elements in accordance with embodiments of the invention.

FIG. 9G schematically depicts an exemplary technique for varying the spacing of the input beams of laser system 900. In FIG. 9G, multiple individual emitters 930 each emit an input beam 105, and the input beams 105 are initially propagating with a spacing 940 therebetween. The input beams 105 are redirected by one or more redirecting elements (e.g., mirrors, lenses, etc.) 950 such that, after redirection, the input beams 105 are spaced at a spacing 910 different from (and in FIG. 9G, smaller than) spacing 940. The redirecting elements 950 may be individually or collectively translated and/or rotated to produce a desired spacing 910 between two or more of the input beams 105. As detailed above, the spacing 910 results in an entry angle 920 that directly impacts the output BPP of the laser system 900. The redirecting elements 950 may be individual discrete elements, or they may be individual portions or segments of a larger redirecting element such as a mirror (e.g., a deformable mirror) or a lens. In addition, while the input beams 105 are shown as substantially parallel before and after redirection by redirection elements 950, in various embodiments of the invention, the propagation angle between the input beams may also be varied, thereby varying the points at which the individual beams strike the focusing lens 910 for focusing toward the fiber 115. As shown in FIG. 8B, such arrangements may enable the selective focusing of one or more input beams (or portions thereof) onto different regions of the fiber 115 (e.g., one or more cladding layers and/or one or more cores).

Figure 9H:
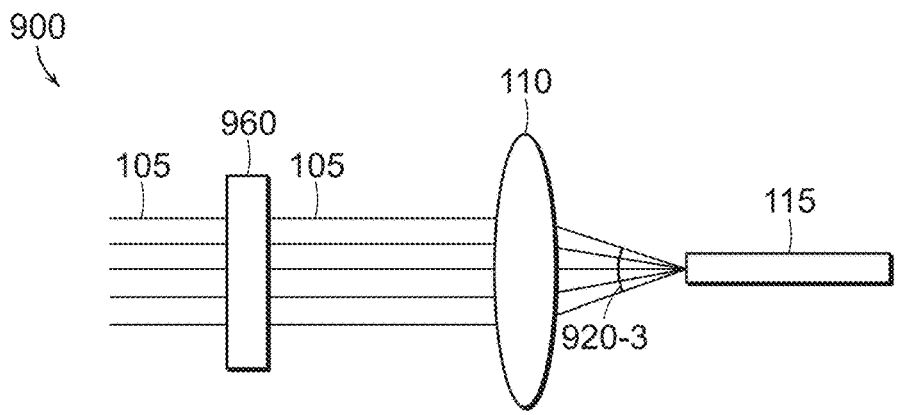
FIGS. 9H-9J are schematic diagrams of laser systems incorporating pathway adjusters in accordance with various embodiments of the invention.
Figure 9I:
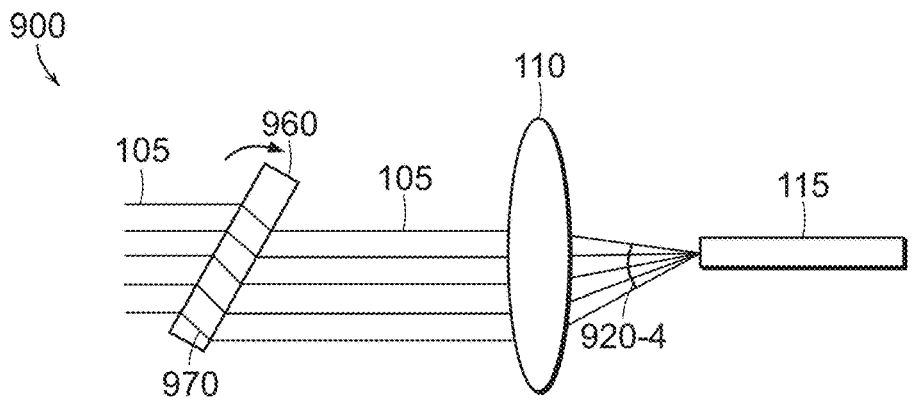

As shown in FIGS. 9H and 9I, the entry angle of the input beams into the optical fiber may be varied even when the spacing between the input beams is substantially unchanged. As shown, a pathway adjuster 960 may be utilized to adjust the propagation path of one or more input beams 105. The pathway adjuster 960 may include or consist essentially of, for example, a prism, a grating, a lens, etc. Although the pathway adjuster 960 is depicted in FIGS. 9H and 9I as a single object, in various embodiments the pathway adjuster 960 includes or consists essentially of a collection of individually controllable (e.g., rotatable and/or translatable) pathway adjusters each receiving one or more input beams (as shown, e.g., in FIG. 9J). As shown in FIG. 9H, in a nominal case, the pathway adjuster 960 does not alter the propagation path of the input beams 105, which are subsequently focused by lens 110 into the fiber 115 with an entry angle 920-3. In FIG. 9I, the pathway adjuster 960 is rotated such that, when the input beams 105 pass through the pathway adjuster 960, they propagate along a path 970 within the pathway adjuster 960 and exit the pathway adjuster 960 having had their propagation path altered. As shown, the input beams 105 subsequently strike the focusing lens 110 in different spatial locations, resulting into their in-coupling into the optical fiber 115 with an entry angle 920-4 different from angle 920-3, thereby altering the output BPP of the laser system 900.

Figure 9J:
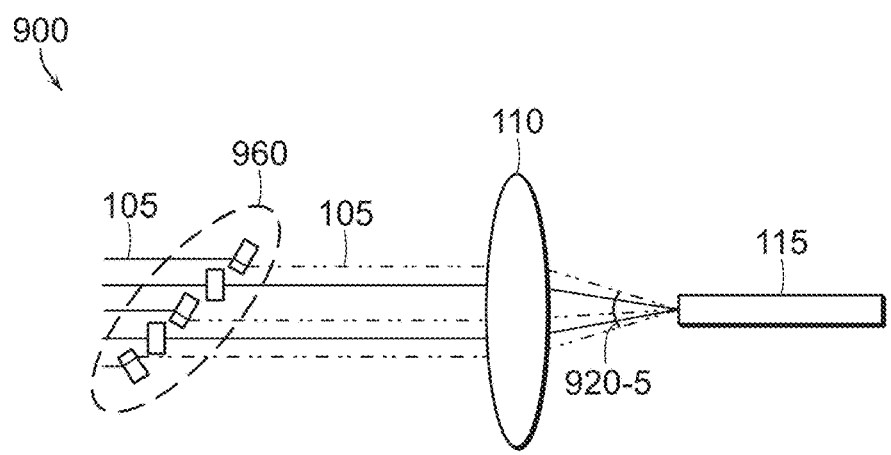

FIG. 9J depicts an exemplary laser system 900 in which the spacing between input beams and the propagation path of individual input beams may both be varied. As shown, each input beam 105 may have its propagation path adjusted by a pathway adjuster 960, thereby changing the spacing between various input beams 105 and/or the locations at which the input beams strike the focusing lens 110 for focusing into the optical fiber 115. In the example shown in FIG. 9J, input beams 105 having their paths adjusted appear as dashed lines, while unadjusted input beams 105 appear as solid lines. Once the input beams 105 strike the focusing lens 110, they are focused into the fiber 115 with an entry angle 920-5 that may vary depending on which (and/or how many) input beams have their paths adjusted and/or to what extent they are adjusted.

The beam quality (and thus BPP) of the output beam of laser systems in accordance with embodiments of the present invention may also be controllably varied by adjusting the power characteristic of one or more of the input beams (which, in turn, impacts the beam quality of the input beam in-coupled into the optical fiber). FIG. 10A depicts an exemplary laser system 1000 in accordance with embodiments of the invention that resembles laser system 900 of FIG. 9B. As shown, the input beams 105-1, 105-2, 105-3 are spaced apart at a particular spacing and focused into the fiber 115 via focusing lens 110. In FIG. 10B, the power characteristic (e.g., output power) of the input beam 105-3 has been reduced, reducing its contribution to the combined beam in-coupled into the fiber 115. This alters the beam quality (and thus the output BPP) of the resulting output beam emitted at the other end of fiber 115. In some embodiments, one or more of the input beams is varied in output power, or even shut off entirely, resulting in changes in the in-coupled beam quality and thus the output BPP of the laser system.

The power characteristic of the input beams may be controlled by a controller 220 that controls the various emitters of each of the input beams. The controller 220 may be programmed to achieve the desired beam conformation (and thus the desired output BPP) via power modulation of one or more of the input beams without undue experimentation by one of skill in the art.

Figure 11A:
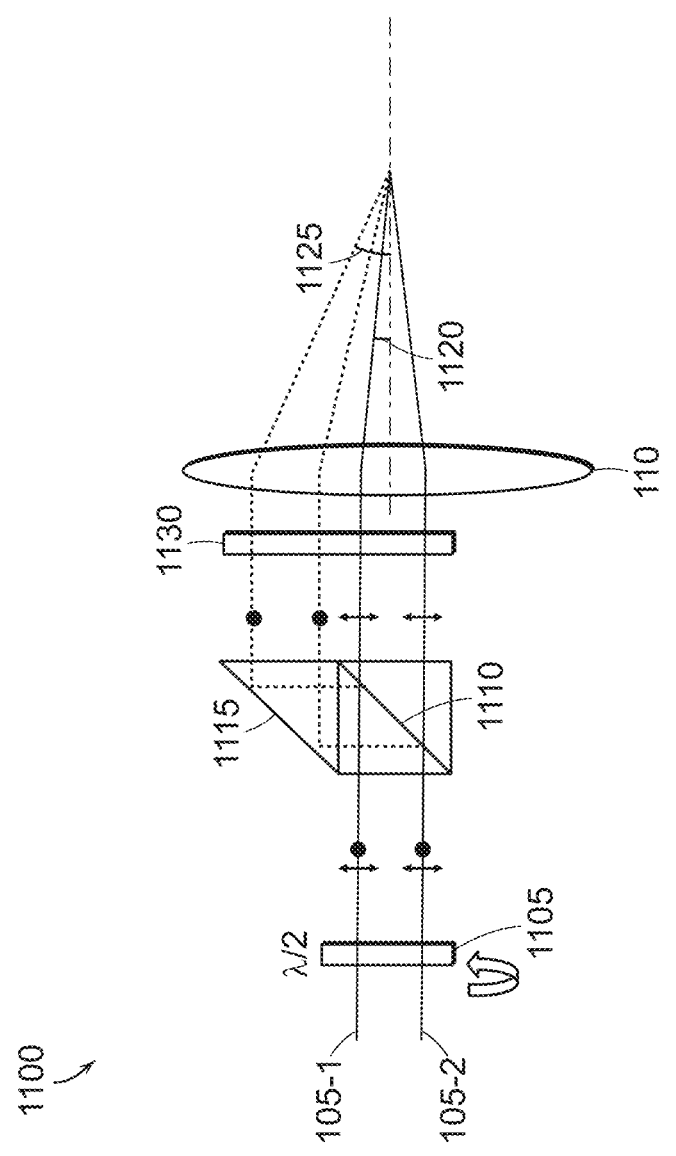
FIG. 11A is a schematic diagram of a laser system in which input beam quality is adjusted on the basis of polarization in accordance with various embodiments of the invention.
Figure 11B:
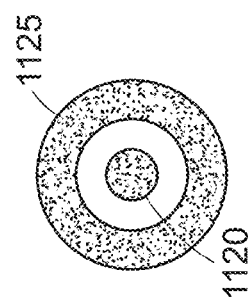
FIG. 11B is a schematic plot of power distribution as a function of input numerical aperture for the laser system of FIG. 11A.

In various embodiments of the present invention, input beam quality is varied (leading to variation in output BPP) on the basis of the polarization state of the input beams. Specifically, input beams may be separated into components having different polarization states and recombined into input beams having desired power levels. Then, one or more of the recombined beams may be focused onto one region of the optical fiber (e.g., the core) while one or more other recombined beams may be focused onto a different region of the optical fiber (e.g., the cladding), resulting in an output beam having a BPP adjustable on the basis of the ratio of power levels of the two recombined beams. FIG. 11A depicts an exemplary laser system 1100 in which two linearly polarized input beams 105-1, 105-2 are manipulated on the basis of polarization. As shown, the two input beams pass through a half-wave plate 1105, which alters the polarization direction of the light of the input beams. Specifically, rotation of the half-wave plate 1105 allocates the power of each of the input beams into one of two different polarization states, e.g., s-polarized (or simply "S") and p-polarized (or simply "P"). As known in the art, p-polarized light has its electric field along the plane of incidence (i.e., the plane made by the propagation direction and a vector perpendicular to the plane of a reflecting surface), while s-polarized light has its electric field normal to the plane of incidence. The half-wave plate 1105 typically includes or consists essentially of a birefringent material (such as quartz or mica), the index of refraction of which is different for different orientations of light passing through it. After passing through the half-wave plate 1105, the input beams are split into S and P components by a polarizer beam splitter 1110 (e.g., a thin-film polarizer or a Wollaston prism), components the relative power of which was selected by the rotation of the half-wave plate 1105. (Note that S and P are designations for any two polarization states that are selectable in this manner.) As shown, the P light passes straight through the polarizer beam splitter 1110, while the S light is split away and directed toward a reflector 1115. Both S and P light are then directed to the focusing lens 110 for focusing into the optical fiber (the optical fiber 115 is not depicted in FIG. 11A and subsequent figures for clarity). The P light may be focused into the optical fiber (e.g., into its core) with a small numerical aperture (or divergence or entry angle) 1120, while the S light, spatially separated from the P light, may be focused into the optical fiber (e.g., into its cladding) with a larger numerical aperture 1125. In this manner, the contributions of the S and P light to the combined output beam (and thus its BPP) may be varied simply by allocating power to the input beams via the half-wave plate 1105. In some embodiments, the S light is focused onto the fiber core while the P light is focused onto the fiber cladding. In other embodiments, after the input beams have been separated on the basis of polarization, and their relative powers allocated via half-wave plate 1105, the S and P light may be directed through a polarization scrambler 1130 that depolarizes the different light beams (e.g., imparts the beams with random polarizations or with both S and P polarizations) before they are focused into different locations of the fiber. The polarization scrambler may include or consist essentially of, for example, a quarter-wave plate. FIG. 11B depicts a schematic plot of the input-beam power within the numerical apertures 1120, 1125 for the laser system 1100 of FIG. 11A.

Figures 11C, 11D:
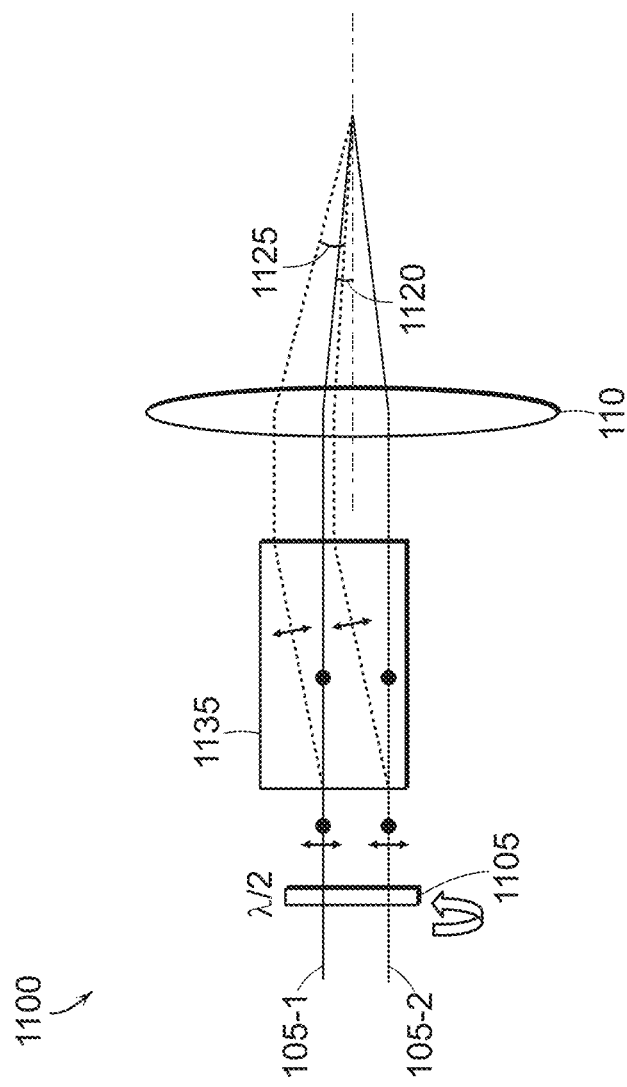
FIG. 11C is a schematic diagram of a laser system in which input beam quality is adjusted on the basis of polarization in accordance with various embodiments of the invention.
FIG. 11D is a schematic plot of power distribution as a function of input numerical aperture for the laser system of FIG. 11C.

Although the laser system 1100 of FIG. 11A separates input beams, by polarization state, into beams that are in-coupled into an optical fiber substantially free of spatial overlap, the beams may also be partially overlapped, as shown in FIG. 11C. In FIG. 11C, the power of the input beams 105-1, 105-2 is again allocated between S and P polarizations via a desired rotation of the half-wave plate 1105, and the resulting beams are split into S and P components by a beam displacer 1135. The beam displacer 1135, which in general splits unpolarized light into polarized beams having orthogonal polarizations and propagating at different angles, may include or consist essentially of a uniaxial crystal of a material such as yttrium vanadate ($YVO_4$), barium borate ($\alpha$-BBO), calcite crystal, or rutile. The S and P components of the input beams are focused by the focusing lens 110 onto different but overlapping regions of the optical fiber, where the S light is focused into the optical fiber (e.g., into its core) with a small numerical aperture (or divergence or entry angle) 1120, while the P light is focused into the optical fiber (e.g., into the cladding and a portion of the core) with a larger numerical aperture 1125, with the P light overlapping the S light upon entry into the fiber. FIG. 11D schematically depicts the power distribution between the numerical apertures 1120, 1125, showing the overlap between the two beam components. As in laser system 1100 of FIG. 11A, the output BPP may be variably selected via the relative allocation of the input beam power into S and P components by the half-wave plate 1105.

Figure 11E:
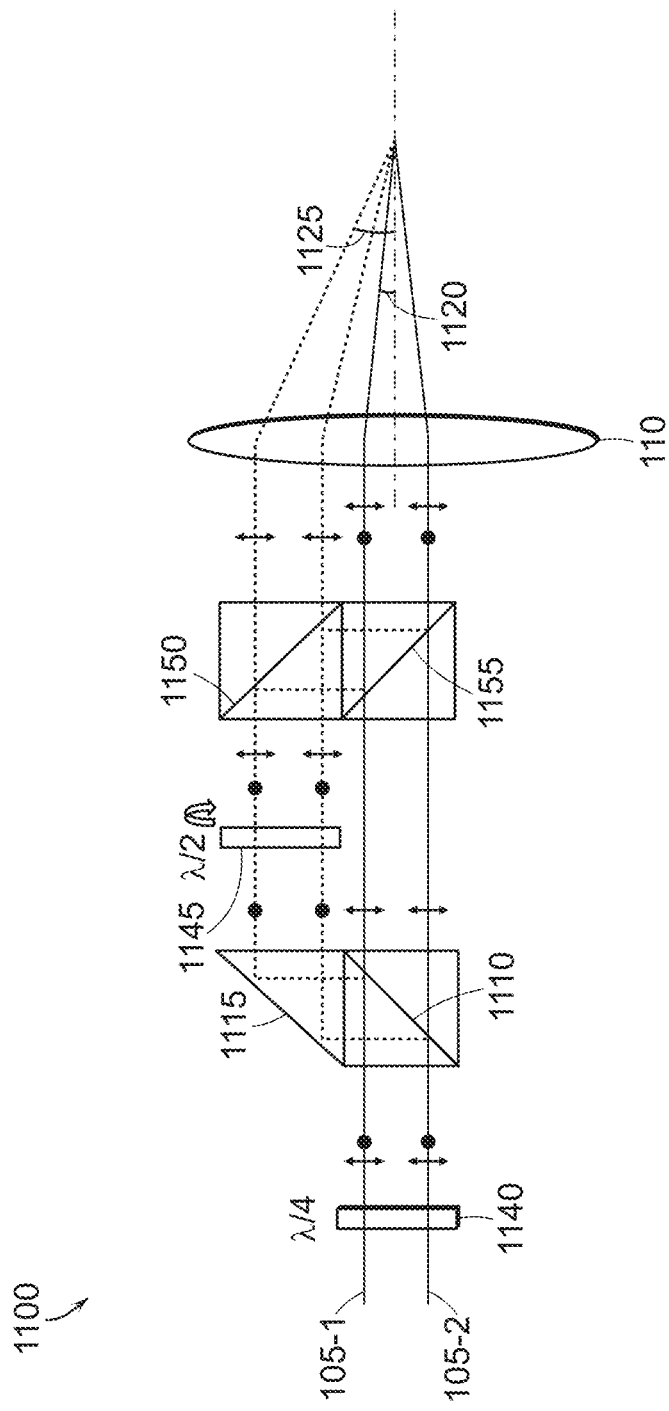

FIG. 11E depicts an exemplary laser system 1100 in accordance with embodiments of the present invention in which up to 50% of the total power of the input beams 105-1, 105-2 may be allocated to the larger numerical aperture 1125 of the optical fiber, the remaining portion being allocated to the smaller numerical aperture 1120. In FIG. 11E, the input beams 105-1, 105-2 are initially randomly polarized and/or are passed through an optional polarization randomizer 1140 (e.g., a quarter-wave plate). As in FIG. 11A, the input beams are then split by polarization beam splitter 1110 into S and P components, and the S components are directed toward reflector 1115. The reflected S components are then repolarized into light beams having both S and P polarizations by a half-wave plate 1145, which is rotated to select the relative amount of S and P polarization in the resulting light beams. The repolarized light beams are directed to a second polarization beam splitter 1150, which passes the P components of the light beams to the focusing lens 110 for focusing into the larger numerical aperture 1125. In this manner, up to 50% of the power of the original input beams 150-1, 150-2 (i.e., up to 100% of the power initially split into S polarization by the polarization beam splitter 1110) may be allocated to the larger numerical aperture 1125. The S light from the half-wave plate 1145 is directed from polarization beam splitter 1150 to another polarization beam splitter 1155, where it is recombined with the P light exiting the initial polarization beam splitter 1110. As shown, that combined light is focused into the smaller numerical aperture 1120.

Figure 11F:
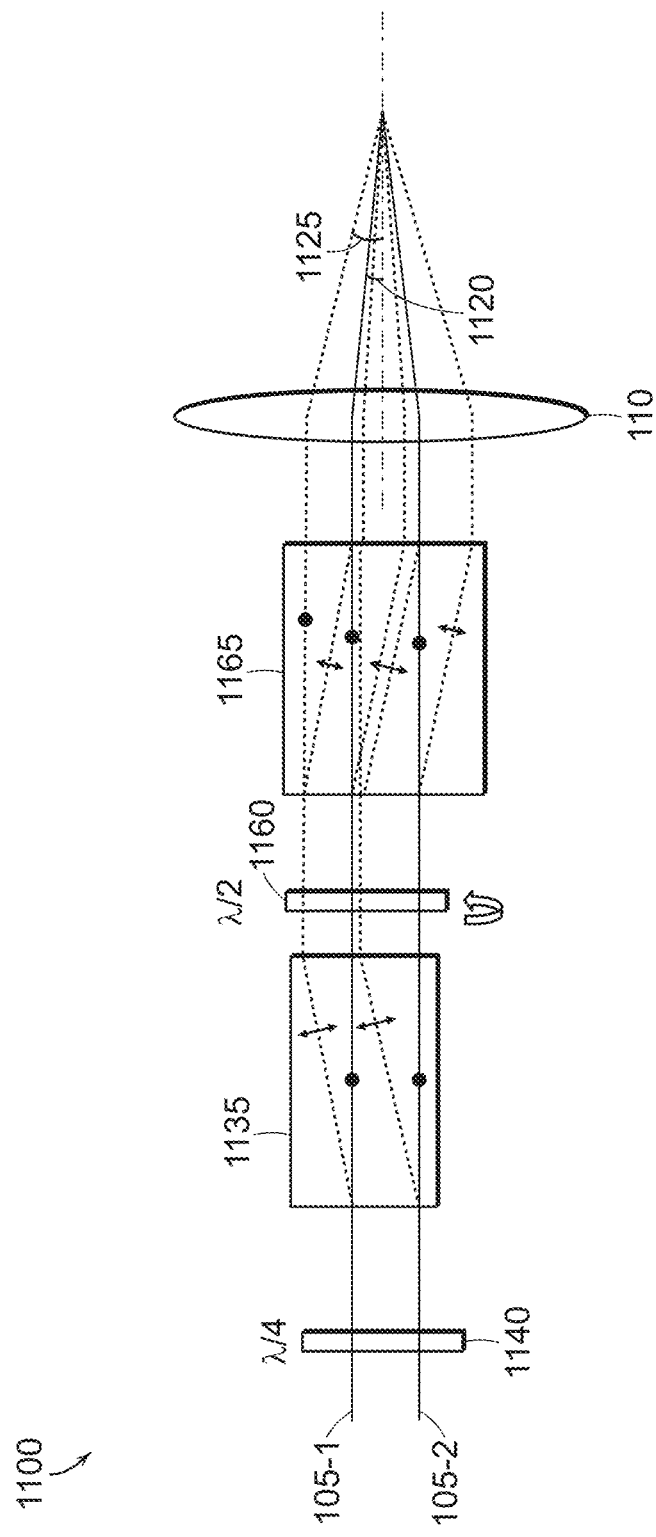

Similarly to FIG. 11C, a laser system 1100 having randomly polarized input beams may also allocate light power between two numerical apertures with overlap of the light. FIG. 11F depicts such an exemplary laser system 1100, in which the input beams 105-1, 105-2 are initially randomly polarized and/or are passed through an optional polarization randomizer 1140 (e.g., a quarter-wave plate). As in FIG. 11C, the beams are directed to beam displacer 1135, which splits the input beams into S and P components. These components pass through a half-wave plate 1160 and then propagate to a beam combiner 1165. The beam combiner 1165, which typically includes or consists essentially of the same optical component as beam displacer 1135, only utilized in the opposite manner, recombines S and P components at its output. As shown, rotation of the half-wave plate 1160 allocates the initial power of input beams 105-1, 105-2 in full or in part to each of the smaller numerical aperture 1120 and the larger numerical aperture 1125 (once the light is focused by the focusing lens 110).

FIGS. 11G and 11H schematically depict the two extreme cases of the laser system 1100 depicted in FIG. 11F. In FIG. 11G, the half-wave plate 1160 is rotated at, for example, 0 degrees or 90 degrees, and thus all of the initial power of the input beams 105-1, 105-2 is allocated to the smaller numerical aperture 1120. In FIG. 11H, the half-wave plate 1160 is rotated at, for example, 45 degrees, and thus all of the initial power of the input beams 105-1, 105-2 is allocated to the larger numerical aperture 1125.

In accordance with various embodiments of the present invention, input-beam light may be separated on the basis of polarization for power allocation among different cladding layers of a multi-cladding optical fiber. FIG. 11I depicts an exemplary laser system 1100 similar to that of FIG. 11A, except that the reflector 1115 is tilted so that the separated S and P components propagate toward the focusing lens 110 at a non-zero angle 1170 therebetween (rather than propagating parallel to each other). As described above, rotation of the half-wave plate 1105 allocates the total power of the input beams 105-1, 105-2 between the two polarization states, one of which is focused to a point 1175 (e.g., to the core of the optical fiber), and the other of which (due to the angle 1170) is focused to a point 1180 different than point 1175 (e.g., to a cladding layer, for example an outer cladding layer surrounding an inner cladding layer, of the optical fiber). Similarly, FIG. 11J depicts an exemplary laser system 1100 similar to that of FIG. 11C, except that a surface 1185 of the beam displacer is cut at an angle (or "wedged") so that the separated S and P components propagate toward the focusing lens 110 at a non-zero angle 1170 therebetween (rather than propagating parallel to each other). As described above, rotation of the half-wave plate 1105 allocates the total power of the input beams 105-1, 105-2 between the two polarization states, one of which is focused to a point 1175 (e.g., to the core of the optical fiber), and the other of which (due to the angle 1170) is focused to a point 1180 different from point 1175. FIG. 11K depicts an exemplary plot of power distribution in the spatial domain within the fiber 115 for the laser systems 1100 depicted in FIGS. 11I and 11J. As shown, the light directed to point 1175 is in-coupled into the core 125 of the fiber, while the light directed to point 1180 is coupled into a second cladding layer 130-2 that surrounds a first cladding layer 130-1. In other embodiments, light directed to point 1180 may be coupled into a second core or a different cladding of a multi-core/multi-cladding fiber. While these examples are variants of the laser systems of FIGS. 11A and 11C utilizing linearly polarized input light, the same principle may be applied to the systems of FIGS. 11E and 11F utilizing randomly polarized input light.

Figure 12A:
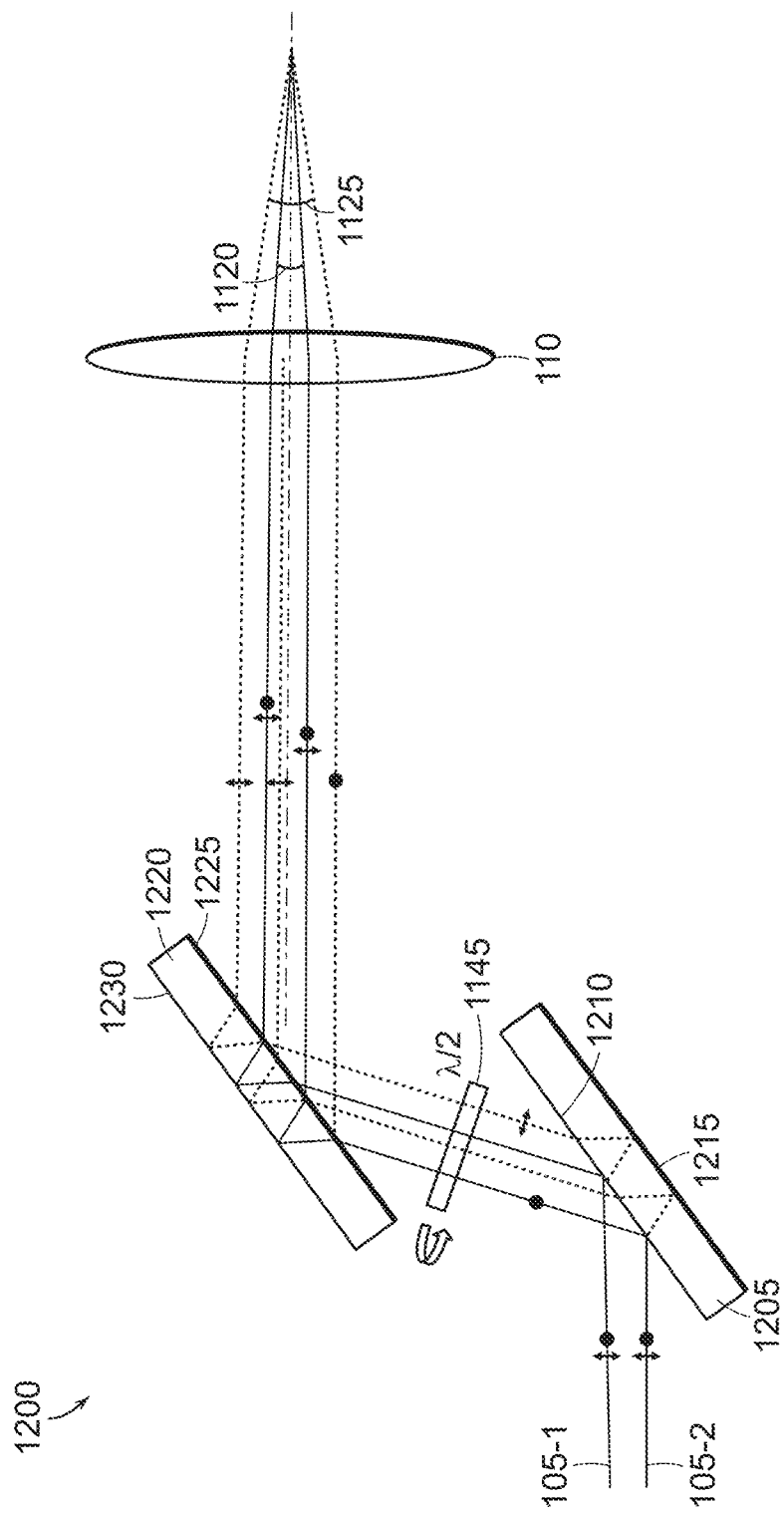
FIGS. 12A-12C are schematic diagrams of laser systems in which input beam quality is adjusted on the basis of polarization in accordance with various embodiments of the invention.

FIG. 12A depicts an exemplary laser system 1200 that is functionally similar to the laser system 1100 depicted in FIG. 11E, in that the rotation of half-wave plate 1145 allocates the total power of input beams 105-1, 105-2 fully or partially to a smaller numerical aperture 1120 or to a larger numerical aperture 1125. In the laser system 1200 of FIG. 12A, the input beams, which may either be randomly polarized or initially pass through a polarization randomizer such as a quarter-wave plate (not shown) propagate to a substantially optically transparent plate 1205 having a polarization beam splitting surface 1210 and a highly reflective surface 1215. As shown, the polarization beam splitting surface 1210 splits the input beams into S and P components, the S component reflecting from the polarization beam splitting surface 1210 toward half-wave plate 1145 and the P component propagating through the plate 1205 and being reflected toward half-wave plate 1145 by reflective surface 1215. As described herein, rotation of the half-wave plate 1145 allocates the total power to the S and P components, which then propagate to a second substantially optically transparent plate 1220 having a polarization beam splitting surface 1225 and a highly reflective surface 1230. As shown, the plate 1220 (and/or its reflective and/or polarization beam splitting surfaces) is generally parallel to the plate 1205 (and/or its reflective and/or polarization beam splitting surfaces). The interaction of the light with the surfaces 1225, 1230 of plate 1220 redistributes the light, allocated via half-wave plate 1145, into components focused by focusing lens 110 into the smaller numerical aperture 1120 and the larger numerical aperture 1125.

Figure 12B:
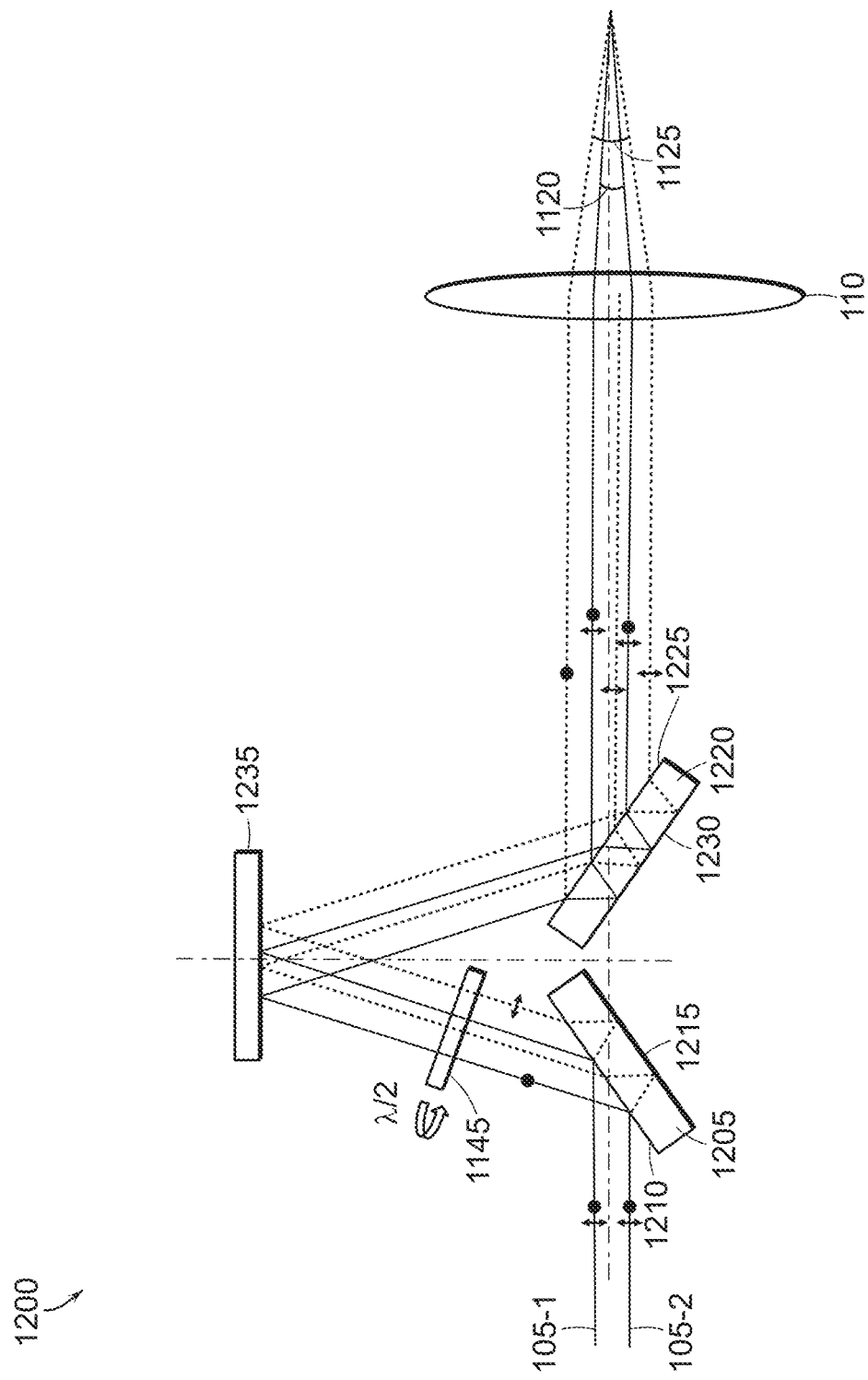

FIG. 12B depicts an exemplary laser system 1200 in accordance with embodiments of the invention that is similar to the laser system 1200 of FIG. 12A. In the laser system 1200 of FIG. 12B, the substantially optically transparent plates 1205, 1220 (and/or their reflective and/or polarization beam splitting surfaces) are arranged at opposite angles, i.e., angles the same rotational distance from zero degrees but in opposite directions. Such arrangements may result in the plates being more easily configured with respect to each other, and the light entering the focusing lens 110 propagates generally along the same path as that of the original input beams 105-1, 105-2. As in laser system 1200 of FIG. 12A, the input beams 105-1, 105-2 propagate to the plate 1205, split into S and P components and reflect toward the half-wave plate 1145. Rotation of the half-wave plate 1145 allocates power between the S and P components, which are then reflected toward plate 1225 by a reflector 1235. As in laser system 1200 of FIG. 12A, the allocated beams are focused by focusing lens 110 into the smaller numerical aperture 1120 and the larger numerical aperture 1125.

Figure 12C:
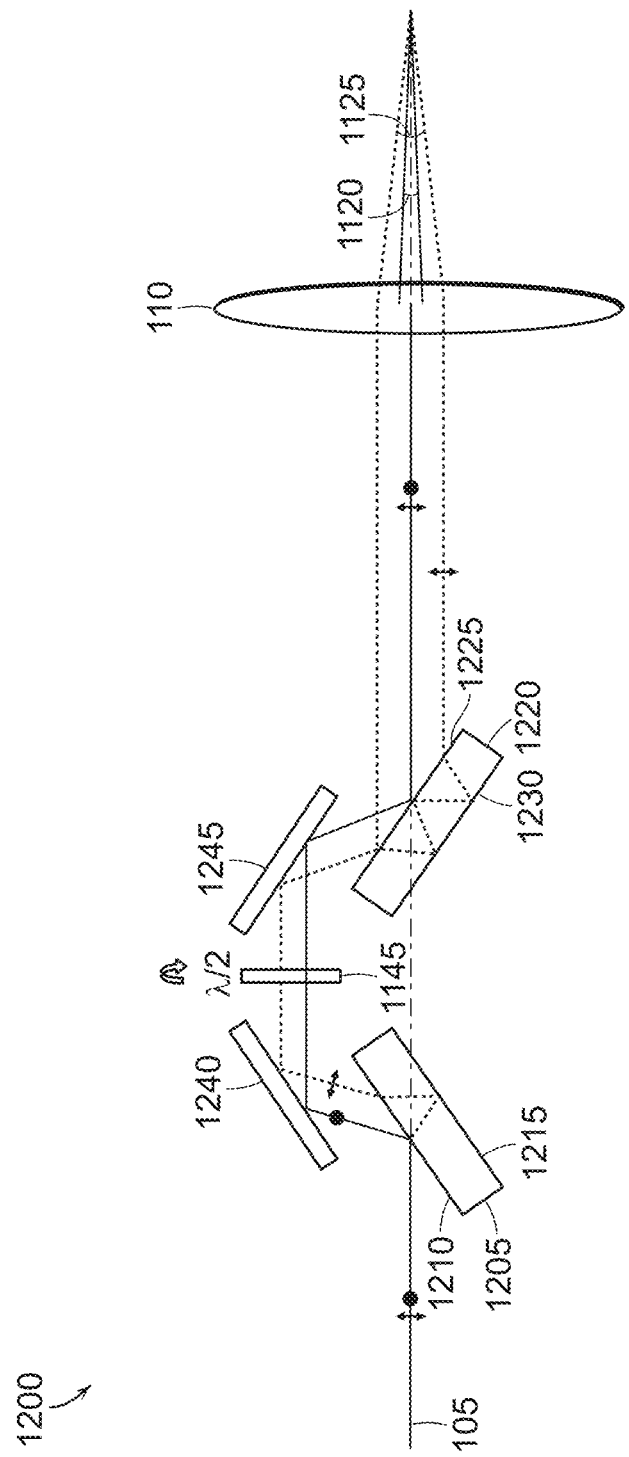

FIG. 12C depicts a similar laser system 1200 in accordance with various embodiments of the invention. As shown, the input beam 105 is directed toward plate 1205, split into S and P components, which are reflected to a reflector 1240 and thence to the half-wave plate 1145.

Rotation of the half-wave plate 1145 allocates power between the S and P components, which are then reflected toward plate 1225 by a reflector 1245. In the laser system 1200 of FIG. 12C, the plates 1205, 1220 and/or the reflectors 1240, 1245 are disposed at opposite angles. As in laser system 1200 of FIG. 12A, the allocated beams are focused by focusing lens 110 into the smaller numerical aperture 1120 and the larger numerical aperture 1125.

Figure 13A:
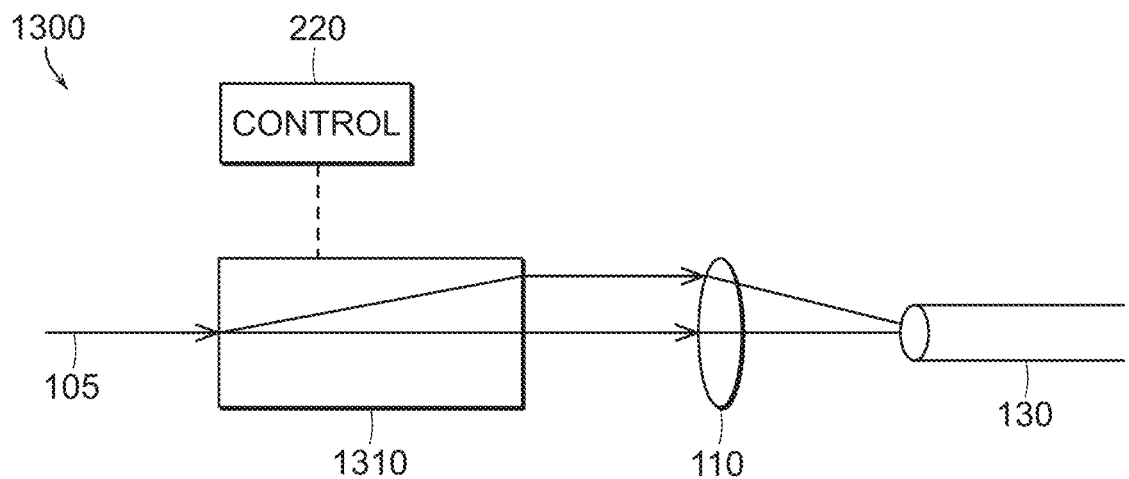
FIGS. 13A and 13B are schematic diagrams of laser systems in accordance with various embodiments of the invention.

As detailed here, the BPP of an output beam that exits an optical fiber or optical waveguide system may be influenced by the angle of incidence each input beam entering the optical fiber, the divergence of each input beam entering the optical fiber, and/or the beam size of the input beam(s) entering the fiber. In addition, as also mentioned with respect to FIG. 8B, the location of the input beams on the fiber entrance (e.g., the input face) may also influence the BPP of the output beam. In another example, FIG. 13A depicts a laser system 1300 in which portions of a multi-wavelength input beam 105 (which may be, for example, the output of a WBC laser system as detailed herein) may be directed to different positions on the entry face of optical fiber 130 via interaction with a uniaxial crystal 1310. As shown, when the input beam 105 enters the uniaxial crystal 1310, the trajectory of a portion of the input beam may be altered by the uniaxial crystal 1310. This altered portion is focused onto the optical fiber via focusing lens 110, but at a slightly different entry position (e.g., within a different core or cladding) than the remaining, unperturbed beam. As known in the art, a uniaxial crystal is a transmissive optical element in which the refractive index of one crystal axis is different from the other two crystal axes. The uniaxial crystal 1310 may include or consist essentially of, for example, calcite, ruby, quartz, magnesium fluoride, and/or rutile). The uniaxial crystal 1310 is responsive to a controller 220. Controller 220 may be conventional, and may be configured to move the uniaxial crystal into and out of (and/or to different positions within) the path of input beam 105 (via, for example, one or more mechanical actuators) in response to a desired output BPP without undue experimentation.

Figure 13B:
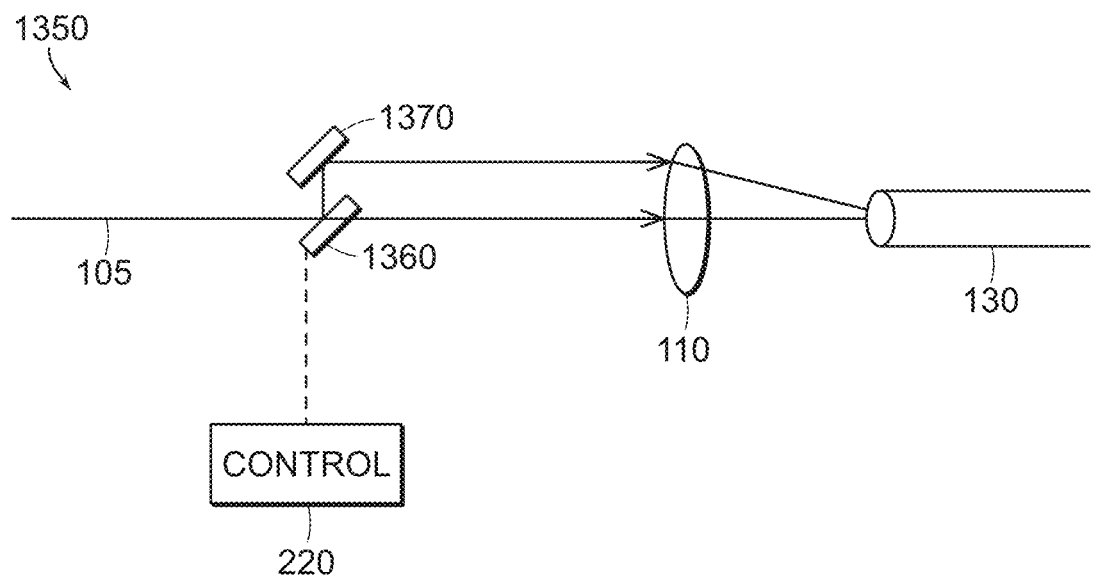

Similarly, FIG. 13B depicts a laser system 1350 in which a portion of the input beam 105 is redirected such that it is coupled into the optical fiber 130 at a different position of the input face via an optical splitter 1360 and a mirror 1370. The optical splitter 1360 may include or consist essentially of, for example, a dichroic or polarizing beam splitter. The optical splitter 1360 and/or the mirror 1370 are responsive to a controller 220. Controller 220 may be conventional, and may be configured to move the optical splitter 1360 and/or the mirror 1370 into and out of (and/or to different positions and/or angles within) the path of input beam 105 (via, for example, one or more mechanical actuators) in response to a desired output BPP without undue experimentation.

Figure 14A:
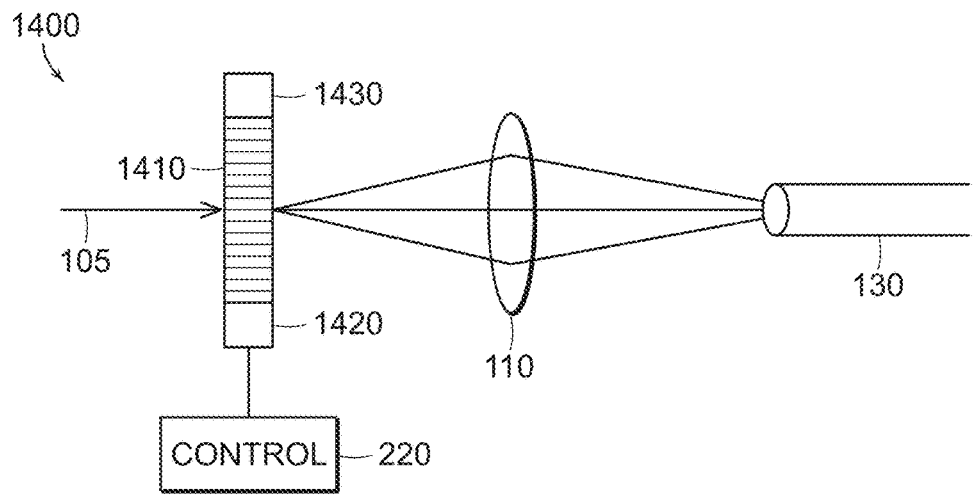
FIGS. 14A-14D are schematic diagrams of laser systems in which input beam quality is adjusted via use of an acousto-optic element in accordance with various embodiments of the invention.

The acousto-optic effect may also be utilized to tailor a desired output BPP via redirection of one or more portions of an input beam onto different in-coupling positions when in-coupling the input beam into an optical fiber. FIG. 14A depicts a laser system 1400 that utilizes an acousto-optic element (or "acousto-optic modulator") 1410 to partition the input beam 105 into different components that are focused onto various positions of the end face of an optical fiber 130 (and/or that have altered spatial power distributions) via one or more focusing lenses 110. As shown, an acoustic transducer 1420 (which may include or consist essentially of, e.g., a piezoelectric transducer and/or a piezoelectric material such as lead zirconate titanate (PZT)) vibrates in response to an oscillating electric signal, creating acoustic waves in the acousto-optic element 1410 that alter its index of refraction in a periodic pattern. The input beam 105 scatters (e.g., diffracts) off the resulting periodic index modulation into one or more orders (or "portions") that may each have a different power (based on the amplitude of the inputs) and angle (based on frequency of the inputs). As shown in FIG. 14A, the focusing lens may focus each resulting order onto a different position on the input face of the optical fiber 130 (and/or with a different spatial power distribution), thereby determining the BPP of the output of the fiber. In various embodiments, the acousto-optic element 1410 may include or consist essentially of fused silica, lithium niobate, arsenic trisulfide, tellurium dioxide, tellurite glass, lead silicate, and/or another acousto-optical material. An acoustic absorber 1430 may be positioned on or proximate acousto-optic element 1410 opposite the acoustic modulator 1420 in order to absorb any sound waves passing through the acousto-optic element 1410. The acousto-optic element and/or acoustic transducer are responsive to a controller 220, as shown in FIG. 14A. Controller 220 may be conventional, and may be configured to introduce and/or control the acousto-optic element and/or acoustic transducer in response to a desired output BPP without undue experimentation.

Figure 14B:
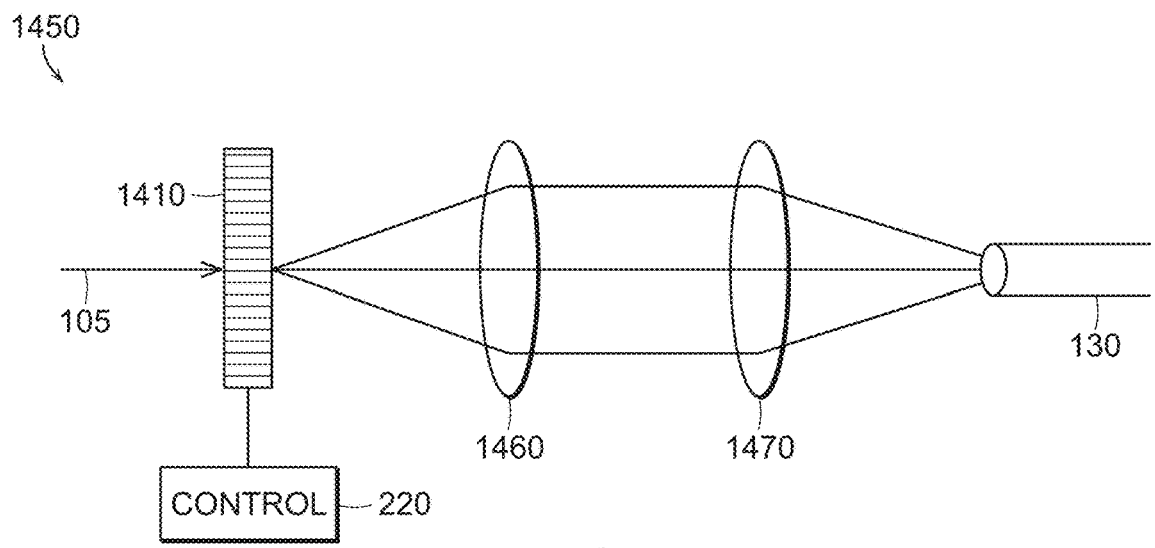
Figure 14C:
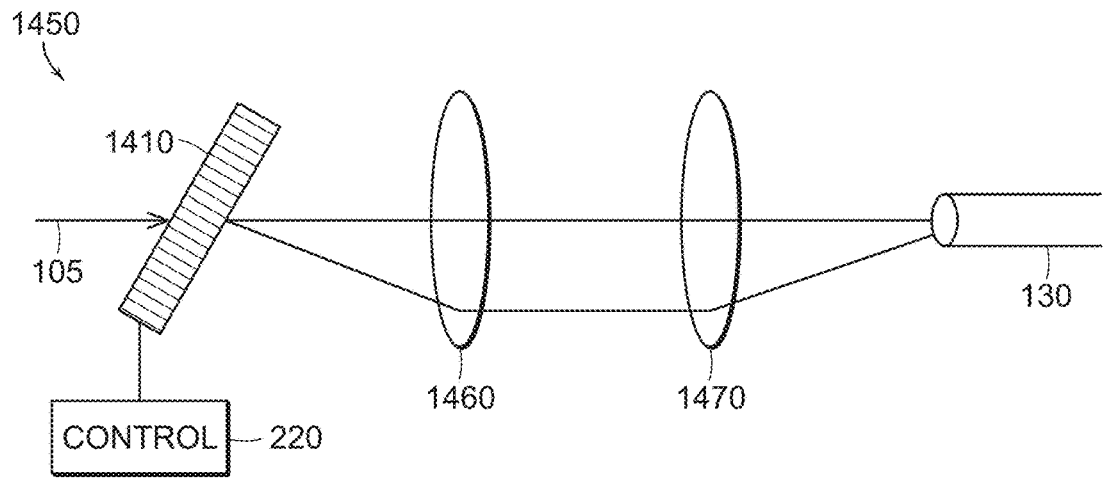

As shown in FIGS. 14B and 14C, the orientation of the acousto-optic element 1410 (e.g., angle relative to the incoming input beam 105) and/or the frequency of the sound waves created therein may be varied to vary the configuration and in-coupling position of the orders scattered by the acousto-optic element 1410. (Note that acoustic transducer 1420 and acoustic absorber 1430 are not shown in FIGS. 14B and 14C for clarity.) In a laser system 1450, the input beam 105 is separated into multiple orders that are intercepted and aligned along a common optical path (albeit separated spatially) by an optical element 1460. The aligned (or collimated) orders are received by an optical element 1470, which focuses the orders (which may each have a different power and/or frequency) onto the input face of the optical fiber 130 (e.g., each order onto a different position on the face). As shown in FIG. 14C, rotation of the acousto-optic element 1410 causes different orders to emerge therefrom at different angles; in this manner, different orders may be intercepted by optical elements 1460, 1470 and in-coupled into the optical fiber 130 at different positions on the input face thereof. In various embodiments, optical element 1460 and/or optical element 1470 includes or consists essentially of one or more focusing and/or collimating lenses.

Figure 14D:
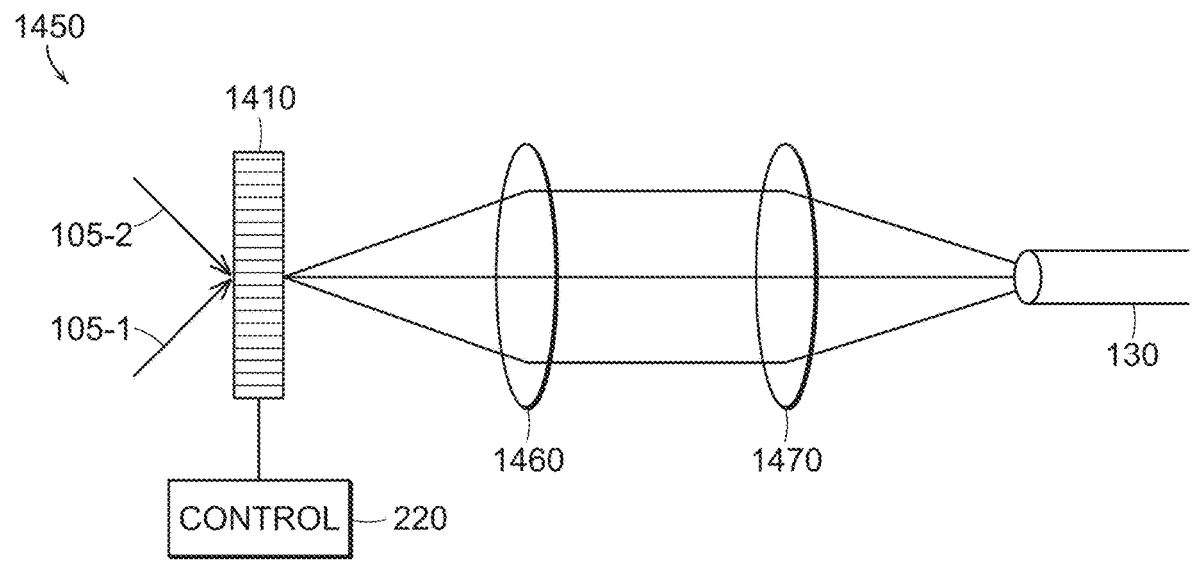

As shown in FIG. 14D, laser system 1450 may be utilized to selectively combine portions of two or more input beams 105. (FIG. 14D depicts two input beams 105-1, 105-2, but embodiments of the invention include more than two input beams.) As shown, each of the multiple input beams 105-1, 105-2 may be separated into multiple different orders by the acousto-optic element 1410. The resulting orders may or may not overlap and are collimated and in-coupled into optical fiber 130 via optical elements 1460, 1470 as detailed above. The positioning, power, and/or frequency (or frequencies) of each of the orders may be controlled via control of the relative angles between the input beams 105-1, 105-2 and the acousto-optic element 1410, as well as, in various embodiments, the frequency and/or amplitude of the sound waves within the acousto-optic element 1410. In this manner, desired portions of one or more input beams may be in-coupled into desired locations of the input face of optical fiber 130 (and/or with desired beam sizes and/or beam angles with respect to the input face of the fiber).

Figure 14E:
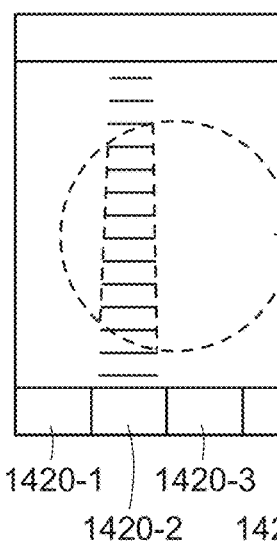
FIGS. 14E and 14F are schematic diagrams of an acousto-optic element in accordance with various embodiments of the invention.
Figure 14F:
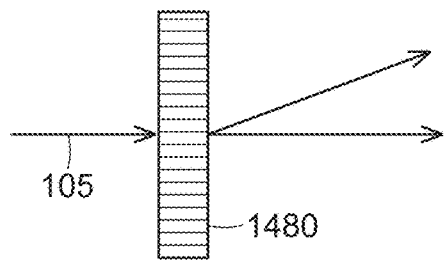

In various embodiments of the present invention, the acousto-optic element may be utilized to modify only a portion of an incoming input beam. As shown in FIGS. 14E and 14F, an acousto-optic element 1480 may have multiple acoustic transducers, each of which generates sound waves that intersect only a portion of an incoming input beam 105. (FIG. 14E shows acousto-optic element 1480 as having four acoustic transducers 1420-1, 1420-2, 1420-3, 1420-4, but embodiments of the invention incorporate one, two, three, or more than four acoustic transducers 1420.) In the example shown in FIG. 14E, acoustic transducer 1420-2 is activated and generating sound waves that interact with only a portion of an incoming input beam 105. As shown in FIG. 14F, this may result in a portion of the beam passing through acousto-optic element 1480 substantially unaffected (e.g., unperturbed and/or undeflected), while a second portion of the beam is diffracted into one or more orders as detailed herein.

Figure 15:
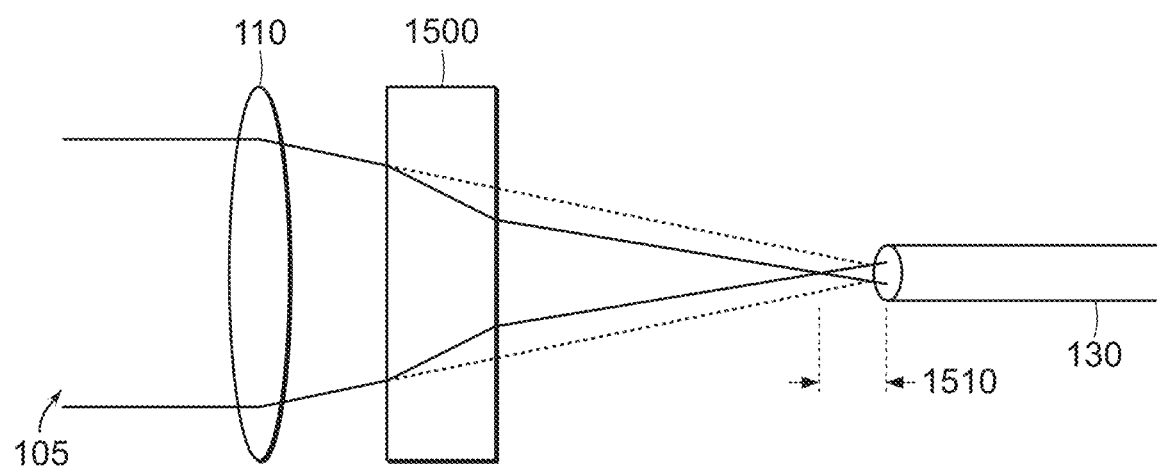
FIG. 15 is a schematic diagram of a laser system in which input beam quality is adjusted via use of a variable refractive index element in accordance with various embodiments of the invention.

Various embodiments of the present invention also vary the focus spot and/or the beam quality of input laser beam(s) in order to enable a controllably variable BPP at the output of the laser system by manipulation of the focal point of focusing optics utilized to in-couple light into the optical fiber. FIG. 15 depicts the utilization of a variable refractive index component 1500 to alter the focal point of focusing lens 110 utilized to in-couple light into optical fiber 130. As shown, input beam 105 is focused by lens 110 to a focal point that may be, for example, proximate or on the input face of the optical fiber 130 in the absence of component 1500 (as shown by the dotted lines in FIG. 15). When the focused light passes through the component 1500, which has a controllable refractive index, the focal point at which the beam is focused is altered by an offset 1510. (While FIG. 15 depicts the altered focal point as being between the component 1500 and the optical fiber 130, in other embodiments the focal point may be farther away from component 1500 than the input face of optical fiber 130.) The amount and/or direction (relative to the input face of optical fiber 130) of the offset 1510 may be changed via changing the refractive index of component 1500. For example, component 1500 may include or consist essentially of an electro-optic material (e.g., lithium niobate, potassium niobate, lithium iodate, etc.) whose refractive index changes as a function of the electric field applied thereto (via, e.g., the Pockels effect and/or Kerr effect). In various embodiments, the component 1500 may even include or consist essentially of a container of gas, the density, flow rate, temperature, and gas type in which may be varied to form a volume of controllably variable refractive index. The component 1500 may be responsive to a controller 220. Controller 220 may be conventional, and may be configured to introduce and/or control the refractive index of component 1500 in response to a desired output BPP without undue experimentation.

Figure 16A:
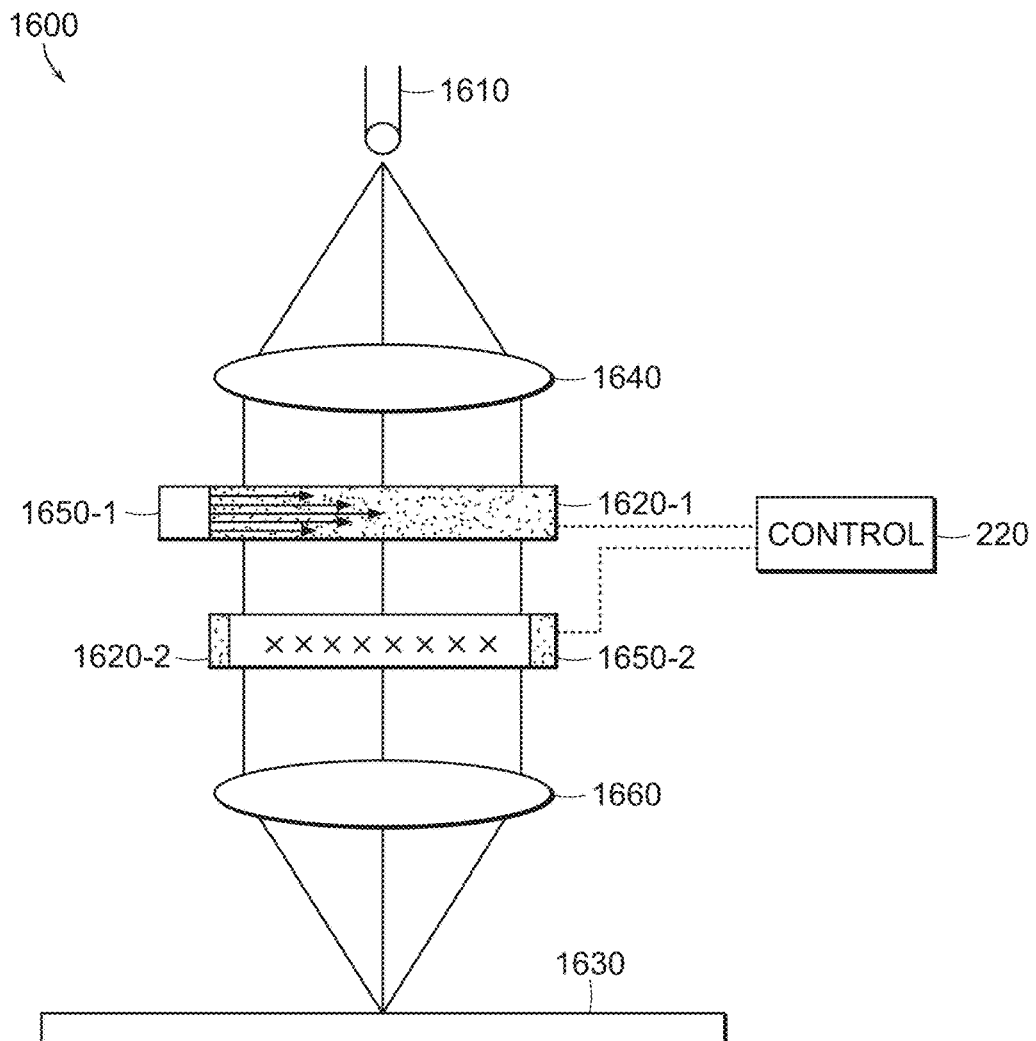
FIGS. 16A, 16B, 17A, and 17B are schematic diagrams of laser delivery systems in which beam quality is adjusted via use of acousto-optic elements in accordance with various embodiments of the invention.
Figure 16B:
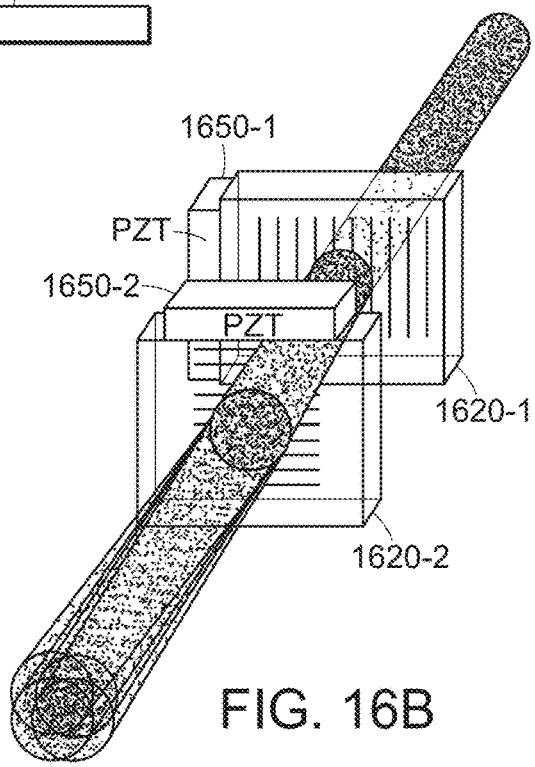

Various embodiments of the present invention utilize acousto-optic elements to vary the BPP of the output beam of a system that is delivering a laser to a workpiece for, e.g., laser welding, laser cutting, laser heating, and/or other applications utilizing laser beams. FIG. 16A depicts a laser delivery system 1600 in which the beam from a source laser 1610 (e.g., a laser source that may include or consist essentially of laser-carrying optical fiber 130 and/or that may correspond to the output of one of the systems detailed herein or another WBC system) is manipulated by multiple acousto-optic elements 1620-1, 1620-2 before being focused onto a workpiece 1630. The beam is initially collimated by optics 1640, which may include or consist essentially of, e.g., one or more lenses such as spherical and/or cylindrical lenses. The beam is then manipulated in multiple dimensions (or equivalently, directions) by acousto-optic elements 1620-1, 1620-2 via sound waves generated by acoustic transducers 1650-1, 1650-2 and responsive to controller 220 as described herein. As shown, the acoustic transducers 1650-1, 1650-2 are positioned such that the beam is manipulated in two orthogonal directions before being focused onto workpiece 1630 by focusing optics 1660, which may include or consist essentially of, e.g., one or more lenses such as spherical and/or cylindrical lenses. As shown, the acoustic transducer 1650-1 generates sound waves, and thus the acousto-optic element 1620-1 manipulates the beam, in the left-right direction in the plane of the drawing, and the acoustic transducer 1650-2 generates sound waves, and thus the acousto-optic element 1620-2 manipulates the beam, in and out of the plane of the drawing. FIG. 16B depicts the manipulations of the beam by acousto-optic elements 1620-1, 1620-2 in a perspective view, illustrating the variation in BPP in orthogonal directions of the beam prior to its delivery to workpiece 1630. While acousto-optic elements 1620-1, 1620-2 generally manipulate the beam in the plane orthogonal to the direction of beam travel, the manipulation directions are not necessarily orthogonal to each other as depicted in FIGS. 16A and 16B.

Figure 17A:
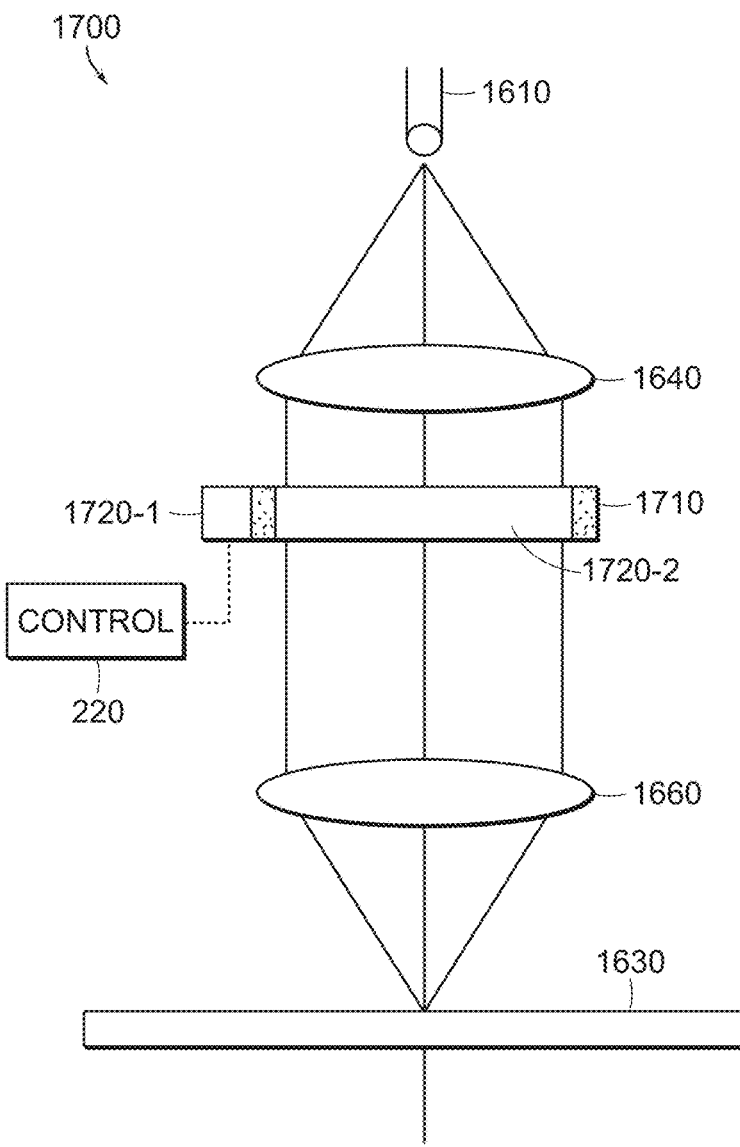
Figure 17B:
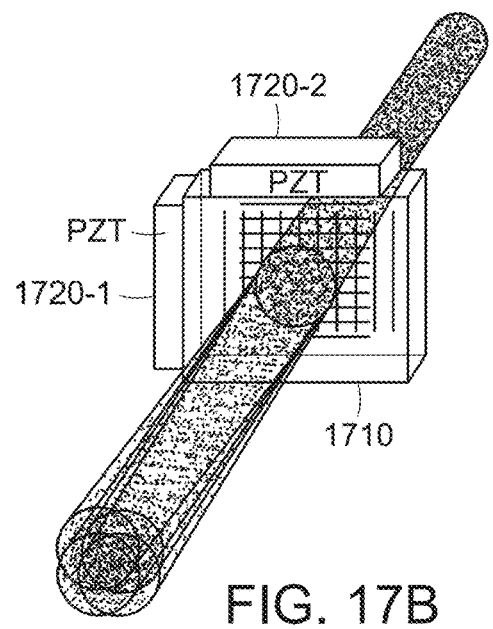

Similarly, FIGS. 17A and 17B depict portions of a laser delivery system 1700 in which the beam from source laser 1610 is manipulated by a single acousto-optic element 1710 before being focused onto a workpiece 1630. As shown, rather than manipulating the laser beam via multiple acousto-optic elements as in laser delivery system 1600, in laser delivery system 1700 multiple acoustic transducers 1720-1, 1720-2 generate sound waves in different (e.g., orthogonal) directions within a single acousto-optic element 1710. Although laser delivery system 1700 is depicted as including two acoustic transducers 1720-1, 1720-2, embodiments of the invention may utilize more than two acoustic transducers each generating sound waves in a different direction. In this manner, the BPP of the laser beam may be modified. For example, different beam shapes and/or intensity profiles desired for particular laser cutting and/or welding applications (or portions thereof) may be formed via control of the acoustic transducers (e.g., the power, amplitude, and/or phase thereof). The acousto-optic elements 1620-1, 1620-2, 1710 and/or acoustic transducers 1650-1, 1650-2, 1720-1, 1720-2 are responsive to a controller 220, as shown in FIGS. 16A and 17A. Controller 220 may be conventional, and may be configured to introduce and/or control the acousto-optic elements and/or acoustic transducers in response to a desired output BPP without undue experimentation.

Both laser delivery systems 1600, 1700 may be utilized to cause up to 50% diffraction efficiency to both +1 and −1 orders. In various embodiments, the spectral range of laser delivery systems 1600, 1700 is 940-980 nm. Via manipulation of the beam prior to delivery to the workpiece, the resulting angular displacement may be, e.g., up to approximately 10 degrees. Beam energy may be up to, for example, 4 kW. The BPP of the beam may be modulated independently in multiple (e.g., X and Y) directions, swept in frequency, and modulated in amplitude. Response times of laser delivery systems 1600, 1700 may be, for example, less than 1 ms.

Figure 18:
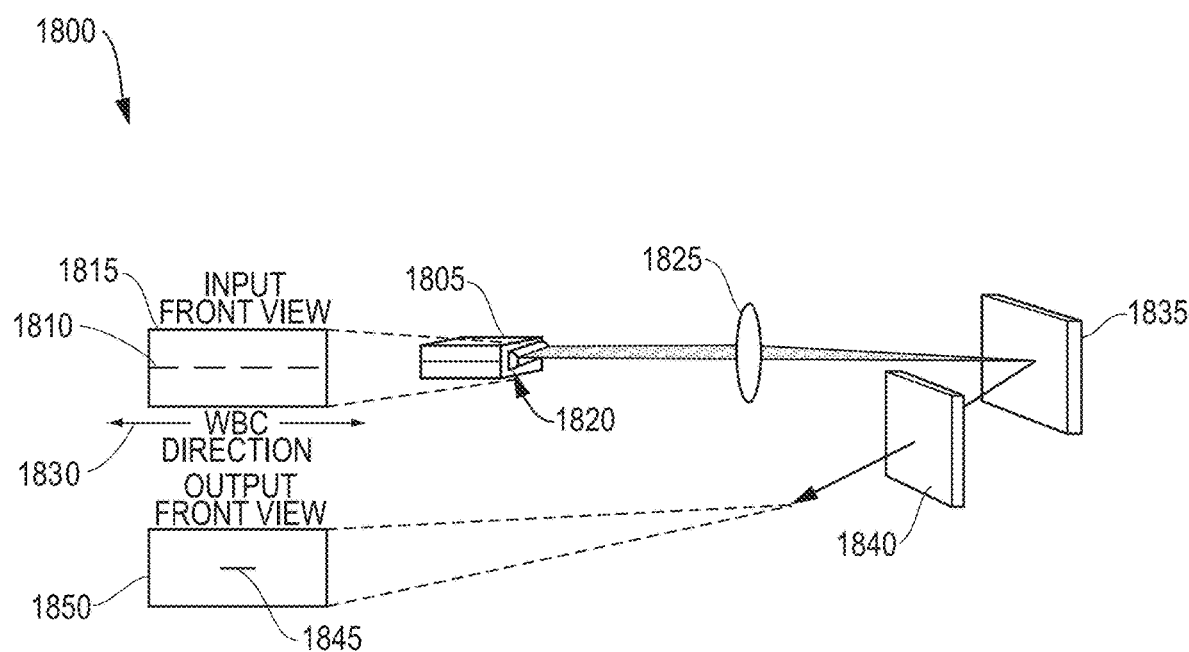
FIG. 18 is a schematic diagram of a wavelength beam combining system in accordance with various embodiments of the invention.

Laser systems and laser delivery systems in accordance with embodiments of the present invention and detailed herein may be utilized in and/or with WBC laser systems. FIG. 18 depicts an exemplary WBC laser system 1800 that utilizes one or more lasers 1805. In the example of FIG. 18, laser 805 features a diode bar having four beam emitters emitting beams 1810 (see magnified input view 1815), but embodiments of the invention may utilize diode bars emitting any number of individual beams or two-dimensional arrays or stacks of diodes or diode bars. In view 1815, each beam 1810 is indicated by a line, where the length or longer dimension of the line represents the slow diverging dimension of the beam, and the height or shorter dimension represents the fast diverging dimension. A collimation optic 1820 may be used to collimate each beam 1810 along the fast dimension. Transform optic(s) 1825, which may include or consist essentially of one or more cylindrical or spherical lenses and/or mirrors, are used to combine each beam 1810 along a WBC direction 1830. The transform optics 1825 then overlap the combined beam onto a dispersive element 1835 (which may include or consist essentially of, e.g., a reflective or transmissive diffraction grating, a dispersive prism, a grism (prism/grating), a transmission grating, or an Echelle grating), and the combined beam is then transmitted as single output profile onto an output coupler 1840. The output coupler 1840 then transmits the combined beams 1845 as shown on the output front view 1850. The output coupler 1840 is typically partially reflective and acts as a common front facet for all the laser elements in this external cavity system 1800. An external cavity is a lasing system where the secondary mirror is displaced at a distance away from the emission aperture or facet of each laser emitter. In some embodiments, additional optics are placed between the emission aperture or facet and the output coupler or partially reflective surface. The output beam 1845 is a thus a multiple-wavelength beam (combining the wavelengths of the individual beams 1810), and may be utilized as input beam 105 in laser systems detailed herein and coupled into an optical fiber (e.g., fiber 130). Beam 1845 (or the output of optical fiber 130) may also be utilized with as the input beam (e.g., source laser 1610) for laser delivery systems 1600, 1700 depicted in FIGS. 16 and 17.

The terms and expressions employed herein are used as terms of description and not of limitation, and there is no intention, in the use of such terms and expressions, of excluding any equivalents of the features shown and described or portions thereof, but it is recognized that various modifications are possible within the scope of the invention claimed.

What is claimed is:

1. A method of producing an output beam, the method comprising:
   receiving a first radiation beam;
   receiving a second radiation beam;
   coupling the first radiation beam into an optical fiber at a first location on an input end of the optical fiber, the optical fiber having at least a first core region and a first cladding region surrounding the first core region;
   coupling the second radiation beam into the optical fiber at a second location on the input end of the optical fiber, the second location being different from the first location;
   emitting an output beam from an output end of the optical fiber, the output beam (i) comprising at least portions of the first and second radiation beams, and (ii) having one or more beam properties different from those of the first radiation beam and/or the second radiation beam,
   wherein coupling the first radiation beam into the optical fiber at the first location on the input end of the optical fiber comprises coupling an entirety of the first radiation beam into the first cladding region of the optical fiber.

2. The method of claim 1, wherein the first radiation beam and the second radiation beam are emitted toward the optical fiber from the same beam source.

3. The method of claim 1, wherein coupling the first radiation beam into the optical fiber comprises focusing the first radiation beam toward the optical fiber with an optical element.

4. The method of claim 3, wherein coupling the second radiation beam into the optical fiber comprises focusing the second radiation beam toward the optical fiber with the optical element.

5. The method of claim 3, wherein, before the first and second radiation beams are coupled into the optical fiber, the first radiation beam has a first trajectory toward the optical fiber and the second radiation beam has a second trajectory, different from the first trajectory, toward the optical fiber.

6. The method of claim 1, wherein at least one of the first radiation beam or the second radiation beam is a multi-wavelength beam composed of a plurality of different wavelengths.

7. The method of claim 1, wherein the second location is larger than the first location.

8. The method of claim 7, wherein the second location encompasses an entirety of the first location.

9. The method of claim 1, wherein the second location at least partially overlaps the first location.

10. The method of claim 1, wherein the first core region is a central core region disposed at a radial center of the optical fiber.

11. The method of claim 1, wherein coupling the second radiation beam into the optical fiber at the second location on the input end of the optical fiber comprises coupling the second radiation beam into a second core region of the optical fiber, the second core region being separated from the first core region by at least the first cladding region.

12. The method of claim 1, wherein coupling the second radiation beam into the optical fiber at the second location on the end face of the optical fiber comprises coupling at least some of the second radiation beam into a cladding region of the optical fiber.

13. The method of claim 1, wherein coupling the second radiation beam into the optical fiber at the second location on the end face of the optical fiber comprises coupling the second radiation beam into both the first core region and a cladding region of the optical fiber.

14. The method of claim 1, wherein coupling the second radiation beam into the optical fiber at the second location on the input end of the optical fiber comprises coupling at least some of the second radiation beam into a second cladding region of the optical fiber different from the first cladding region.

15. The method of claim 1, wherein power levels of the first radiation beam and the second radiation beam are different.

16. The method of claim 1, further comprising utilizing at least a portion of the output beam to process a workpiece.

17. The method of claim 16, wherein the workpiece is at least one of welded, cut, heated, or drilled with the at least a portion of the output beam.

18. The method of claim 1, wherein the first radiation beam is emitted toward the optical fiber by a beam source comprising (i) a plurality of emitters collectively emitting a plurality of beams, (ii) a dispersive element for combining the plurality of beams, and (iii) a partially reflecting output coupler from which the first radiation beam is emitted.

\* \* \* \* \*